United States Patent
Heo et al.

(10) Patent No.: US 11,557,741 B2
(45) Date of Patent: Jan. 17, 2023

(54) PHOTOELECTRIC CONVERSION DEVICES AND ORGANIC SENSORS AND ELECTRONIC DEVICES

(71) Applicant: Samsung Electronics Co., Ltd., Suwon-si (KR)

(72) Inventors: Chul Joon Heo, Busan (KR); Kyung Bae Park, Hwaseong-si (KR); Hyun Bum Kang, Yongin-si (KR); Sung Jun Park, Yongin-si (KR); Jeong Il Park, Seongnam-si (KR); Chul Baik, Suwon-si (KR); Ji Soo Shin, Seoul (KR); Sung Young Yun, Suwon-si (KR); Gae Hwang Lee, Seongnam-si (KR); Don-Wook Lee, Seoul (KR); Eun Kyung Lee, Seoul (KR); Yong Wan Jin, Seoul (KR); Yeong Suk Choi, Suwon-si (KR); Taejin Choi, Suwon-si (KR)

(73) Assignee: Samsung Electronics Co., Ltd., Geonggi-Do (KR)

( * ) Notice: Subject to any disclaimer, the term of this patent is extended or adjusted under 35 U.S.C. 154(b) by 0 days.

(21) Appl. No.: 16/519,448

(22) Filed: Jul. 23, 2019

(65) Prior Publication Data
US 2020/0152898 A1    May 14, 2020

(30) Foreign Application Priority Data
Nov. 14, 2018    (KR) .................. 10-2018-0139826

(51) Int. Cl.
*H01L 51/42* (2006.01)
*H01L 51/44* (2006.01)
*H01L 51/00* (2006.01)

(52) U.S. Cl.
CPC ...... *H01L 51/4246* (2013.01); *H01L 51/4273* (2013.01); *H01L 51/441* (2013.01);
(Continued)

(58) Field of Classification Search
None
See application file for complete search history.

(56) References Cited

U.S. PATENT DOCUMENTS 8,704,213 B2    4/2014    Suzuki
9,455,059 B2    9/2016    Blouin et al.
(Continued)

FOREIGN PATENT DOCUMENTS

EP    2259358 A2    12/2010
EP    2448031 A2    5/2012
(Continued)

OTHER PUBLICATIONS

European Office Action dated May 10, 2022 for corresponding European Application No. 19204007.9.
(Continued)

*Primary Examiner* — Evren Seven
(74) *Attorney, Agent, or Firm* — Harness, Dickey & Pierce, P.L.C.

(57) ABSTRACT

A photoelectric conversion device includes a first electrode and a second electrode facing each other, a photoelectric conversion layer between the first electrode and the second electrode and configured to absorb light in at least one part of a wavelength spectrum of light and to convert it into an electric signal, and an organic auxiliary layer between the first electrode and the photoelectric conversion layer and having a higher charge mobility than a charge mobility of the photoelectric conversion layer. An organic sensor may include the photoelectric conversion device. An electronic device may include the organic sensor.

32 Claims, 19 Drawing Sheets

(52) U.S. Cl.
CPC ...... *H01L 51/0046* (2013.01); *H01L 51/0058* (2013.01); *H01L 51/0071* (2013.01); *H01L 2251/308* (2013.01)

(56) References Cited

U.S. PATENT DOCUMENTS

| | | | |
|---|---|---|---|
| 9,728,586 B2 | 8/2017 | Lee et al. | |
| 10,199,589 B2 | 2/2019 | Umehara et al. | |
| 10,236,461 B2 | 3/2019 | Ro et al. | |
| 10,256,414 B2 | 4/2019 | Lim et al. | |
| 2007/0063156 A1 | 3/2007 | Hayashi | |
| 2013/0104968 A1* | 5/2013 | Pfeiffer | H01L 31/035272 977/734 |
| 2013/0168790 A1 | 7/2013 | Hayashi | |
| 2014/0209173 A1 | 7/2014 | Momose | |
| 2016/0013248 A1 | 1/2016 | Sawaki | |
| 2016/0226005 A1 | 8/2016 | Park et al. | |
| 2017/0154929 A1 | 6/2017 | Leem et al. | |
| 2017/0294593 A1 | 10/2017 | Miyazaki et al. | |
| 2017/0309849 A1 | 10/2017 | Umehara et al. | |
| 2018/0062112 A1 | 3/2018 | Heo et al. | |
| 2018/0123050 A1 | 5/2018 | Rosselli et al. | |

FOREIGN PATENT DOCUMENTS

| | | |
|---|---|---|
| EP | 3300114 A1 | 3/2018 |
| EP | 3306689 A1 | 4/2018 |
| JP | 2007-088033 A | 4/2007 |
| JP | 2007-311647 A | 11/2007 |
| JP | 5323025 B2 | 10/2013 |
| JP | 2016-185914 A | 10/2016 |
| JP | 6145872 B2 | 6/2017 |
| KR | 2015-0066616 A | 6/2015 |
| KR | 101572061 B1 | 11/2015 |
| KR | 2016-0009953 A | 1/2016 |
| KR | 10-2016-0094704 A | 8/2016 |
| KR | 10-2017-0063087 A | 6/2017 |
| KR | 10-2017-0131193 A | 11/2017 |
| KR | 10-2018-0024296 A | 3/2018 |
| WO | WO-2010/095517 A1 | 8/2010 |
| WO | WO-2016-111140 A1 | 7/2016 |
| WO | WO-2017/095517 A1 | 6/2017 |

OTHER PUBLICATIONS

Ishiyama Norihiro et al., "Tandem organic solar cells formed in co-deposited films by doping", Organic Electronics, vol. 14, No. 7, Apr. 15, 2013, pp. 1793-1796, XP028554612, ISSN: 1566-1199, DOI: 10.1016/J.ORGEL.2013.04.003.

Extended European Search Report dated Mar. 26, 2020 for corresponding European Application No. 19204007.9.

Replacement Extended European Search Report dated Apr. 29, 2020 for corresponding European Application No. 19204007.9.

Yang, Ke et al., "Determination of Electron and Hole Mobility of Regioregular Poly(3-hexylthiophene) by the Time of Flight Method", Journal of Macromolecular Scient, Part A, Pure and Applied Chemistry, vol. 44, No. 12, Oct. 1, 2007, pp. 1261-1264.

Gao, Hongze et al., "Theoretical Characterization of a Typical Hole/Exciton-Blocking Material Bathocuproine and Its Analogues", Journal of Physical Chemistry, A, Molecules, vol. 112, No. 38, Aug. 27, 2008, pp. 9097-9103.

Rutledge, S. A. et al., "Carrier mobility enhancement in poly(3,4-ethylenedioxythiophene)-poly(styrenesulfonate) having undergone rapid thermal annealing", Journal of Applied Physics, vol. 114, No. 13, Oct. 7, 2018, p. 133708.

* cited by examiner

PHOTOELECTRIC CONVERSION DEVICES AND ORGANIC SENSORS AND ELECTRONIC DEVICES

CROSS-REFERENCE TO RELATED APPLICATION

This application claims priority to and the benefit of Korean Patent Application No. 10-2018-0139826 filed in the Korean Intellectual Property Office on Nov. 14, 2018, the entire contents of which are incorporated herein by reference.

BACKGROUND

1. Field

Photoelectric conversion devices, organic sensors, and electronic devices are disclosed.

2. Description of the Related Art

A photoelectric conversion device may receive incident light and convert the received incident light into an electric signal. A photoelectric conversion device may include a photodiode and a phototransistor, and may be applied to ("included in") an organic sensor, a photodetector, a solar cell, or the like.

Organic sensors may have higher resolutions and thus may have smaller pixel sizes. Organic sensors may include silicon photodiodes. A sensitivity of a silicon photodiode in an organic sensor may be deteriorated based on reduced pixel size of the organic sensor, as the absorption area of the silicon photodiode may be reduced. Accordingly, organic materials that are capable of replacing silicon in photodiodes of organic sensors have been researched.

An organic material has a high extinction coefficient and is configured to selectively absorb light in a particular wavelength spectrum of light depending on a molecular structure of the organic material, and thus may simultaneously replace a photodiode and a color filter of an organic sensor and resultantly improve sensitivity of the organic sensor and contribute to high integration of the organic sensor.

However, since such organic materials exhibit different characteristics from those of silicon due to high binding energy and a recombination behavior associated with such organic materials, the characteristics of the organic materials are difficult to precisely predict, and thus required properties of a photoelectric conversion device may not be easily controlled.

SUMMARY

Some example embodiments provide one or more photoelectric conversion devices capable of improving charge extraction efficiency.

Some example embodiments provide organic sensors including one or more of the photoelectric conversion devices.

some example embodiments provide electronic devices including the one or more photoelectric conversion devices or the one or more organic sensors.

According to some example embodiments, a photoelectric conversion device may include a first electrode and a second electrode facing each other, a photoelectric conversion layer between the first electrode and the second electrode, the photoelectric conversion layer configured to absorb light in at least one part of a wavelength spectrum of light and to convert the absorbed light into an electric signal, and an organic auxiliary layer between the first electrode and the photoelectric conversion layer, the organic auxiliary layer having a higher charge mobility than a charge mobility of the photoelectric conversion layer.

The charge mobility of the organic auxiliary layer may be at least about 100 times as high as the charge mobility of the photoelectric conversion layer.

The charge mobility of the organic auxiliary layer may be greater than or equal to about $1.0 \times 10^{-3}$ cm$^2$/Vs.

The photoelectric conversion layer may include a first organic material, the organic auxiliary layer may include a second organic material that is different from the first organic material, and the charge mobility of the second organic material may be about 100 times or greater as high as the charge mobility of the first organic material.

The charge mobility of the second organic material may be greater than or equal to about $1.0 \times 10^{-3}$ cm$^2$/Vs.

The second organic material may include a second organic material compound that is a fused polycyclic aromatic compound, a fused polycyclic heteroaromatic compound, or a combination thereof.

The second organic material compound may include at least four rings that are fused.

The second organic material compound may be the fused polycyclic heteroaromatic compound, and the fused polycyclic heteroaromatic compound may include S, Se, Te, or a combination thereof.

The photoelectric conversion layer may further include a semiconductor that forms a pn junction with the first organic material, the semiconductor material including a p-type semiconductor and/or an n-type semiconductor, and the organic auxiliary layer may further include the semiconductor.

The semiconductor may include fullerene or a fullerene derivative.

A thickness of the organic auxiliary layer may be less than or equal to about 5 nm.

The photoelectric conversion device may further include an inorganic nanolayer between the first electrode and the photoelectric conversion layer.

The inorganic nanolayer may include a lanthanide element, calcium (Ca), potassium (K), aluminum (Al), or an alloy thereof.

The lanthanide element may include ytterbium (Yb).

A thickness of the inorganic nanolayer may be less than or equal to about 5 nm.

The organic auxiliary layer may be in contact with the photoelectric conversion layer and the inorganic nanolayer may be in contact with the first electrode.

The first electrode may be a cathode and the second electrode may be an anode.

An electronic device may include the photoelectric conversion device.

An organic sensor may include the photoelectric conversion device.

An electronic device may include the organic sensor.

According to some example embodiments, an organic sensor may include a semiconductor substrate; and a plurality of photoelectric conversion devices on the semiconductor substrate. The plurality of photoelectric conversion devices may be configured to convert different wavelength spectra of light into electric signals, respectively. Each photoelectric conversion device of the plurality of photoelectric conversion devices may include a first electrode and a second electrode facing each other, a photoelectric conversion layer between the first electrode and the second electrode, the photoelectric conversion layer configured to absorb light in at least one part of a wavelength spectrum of light and to convert the absorbed light into an electric signal, and an organic auxiliary layer between the first electrode and the photoelectric conversion layer, the organic auxiliary layer having a higher charge mobility than a charge mobility of the photoelectric conversion layer. The photoelectric conversion devices of the plurality of photoelectric conversion devices may include different photoelectric conversion layers configured to absorb different wavelength spectra of light.

The plurality of photoelectric conversion devices may be arranged horizontally on the semiconductor substrate, such that the plurality of photoelectric conversion devices overlap each other in a direction extending parallel to a top surface of the semiconductor substrate.

The plurality of photoelectric conversion devices may be arranged vertically on the semiconductor substrate, such that the plurality of photoelectric conversion devices overlap each other in a direction extending perpendicular to a top surface of the semiconductor substrate, and one photoelectric conversion device of the plurality of photoelectric conversion devices may overlap with a limited portion of another photoelectric conversion device of the plurality of photoelectric conversion devices in the direction extending perpendicular to the top surface of the semiconductor substrate.

The charge mobility of the organic auxiliary layer of a given photoelectric conversion device of the plurality of photoelectric conversion devices may be at least about 100 times as high as the charge mobility of the photoelectric conversion layer of the given photoelectric conversion device.

The photoelectric conversion layer of a given photoelectric conversion device of the plurality of photoelectric conversion devices may include a first organic material, the organic auxiliary layer of the given photoelectric conversion device may include a second organic material that is different from the first organic material, and the charge mobility of the second organic material may be about 100 times or greater as high as the charge mobility of the first organic material.

At least one photoelectric conversion device of the plurality of photoelectric conversion devices may include an inorganic nanolayer between the first electrode of the at least one photoelectric conversion device and the photoelectric conversion layer of the at least one photoelectric conversion device.

The plurality of photoelectric conversion devices may include a common first electrode that extends continuously between the plurality of photoelectric conversion devices.

According to some example embodiments, an organic sensor may include a semiconductor substrate; a photo-sensing device integrated in the semiconductor substrate, the photo-sensing device configured to convert a first wavelength spectrum of light into electric signals; and a photoelectric conversion device on the semiconductor substrate, the photoelectric conversion device configured to convert a second wavelength spectrum of light into electric signals. The photoelectric conversion device may include a first electrode and a second electrode facing each other, a photoelectric conversion layer between the first electrode and the second electrode, the photoelectric conversion layer configured to absorb light in at least one part of a wavelength spectrum of light and to convert the absorbed light into an electric signal, and an organic auxiliary layer between the first electrode and the photoelectric conversion layer, the organic auxiliary layer having a higher charge mobility than a charge mobility of the photoelectric conversion layer.

The organic sensor may further include a color filter configured to selectively transmit a wavelength spectrum of light to the photo-sensing device, such that the photo-sensing device is configured to absorb the wavelength spectrum of light.

The charge mobility of the organic auxiliary layer may be at least about 100 times as high as the charge mobility of the photoelectric conversion layer.

The photoelectric conversion layer may include a first organic material, the organic auxiliary layer may include a second organic material that is different from the first organic material, and the charge mobility of the second organic material may be about 100 times or greater as high as the charge mobility of the first organic material.

The photoelectric conversion device may further include an inorganic nanolayer between the first electrode and the photoelectric conversion layer.

By improving the charge mobility, residual charges may be reduced and thus charge extraction efficiency of the photoelectric conversion device may be increased.

DETAILED DESCRIPTION

Figure 1:
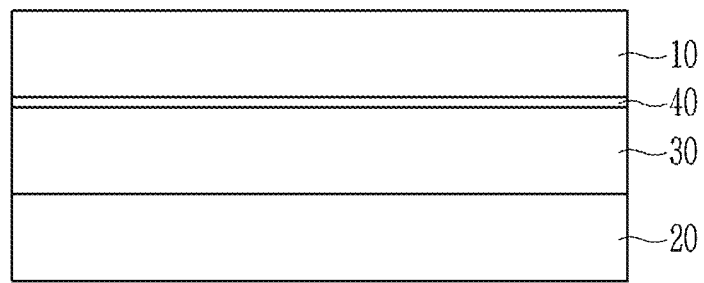
FIG. 1 is a cross-sectional view showing an example of a photoelectric conversion device according to some example embodiments.

Hereinafter, example embodiments of the present disclosure will be described in detail so that a person skilled in the art would understand the same. However, this disclosure may be embodied in many different forms and is not to be construed as limited to the example embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

As used herein, when a definition is not otherwise provided, "substituted" may refer to replacement of a hydrogen atom of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" may refer to one including 1 to 4 heteroatoms selected from N, O, S, Se, Te, Si, and P.

As used herein, when a definition is not otherwise provided, "heterocyclic group" is a generic concept of a heteroaryl group, may include an aromatic and non-aromatic ring including at least one heteroatom, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

Hereinafter, "combination" may refer to a mixture of two or more and a stack structure of two or more.

Hereinafter, a work function or an energy level is expressed as an absolute value from a vacuum level. In addition, when the work function or the energy level is referred to be deep, high, or large, it may have a large absolute value from "0 eV" of the vacuum level while when the work function or the energy level is referred to be shallow, low, or small, it may have a small absolute value from "0 eV" of the vacuum level.

Hereinafter, the charge mobility may be a value estimated in a diode structure.

Hereinafter, a photoelectric conversion device according to some example embodiments is described.

FIG. 1 is a cross-sectional view showing an example of a photoelectric conversion device according to some example embodiments.

Referring to FIG. 1, a photoelectric conversion device 100 according to some example embodiments includes a first electrode 10, a second electrode 20, a photoelectric conversion layer 30, and an organic auxiliary layer 40.

A substrate (not shown) may be disposed at the side of the first electrode 10 or the second electrode 20. The substrate may be for example made of an inorganic material such as glass, an organic material such as polycarbonate, polymethylmethacrylate, polyethyleneterephthalate, polyethylenenaphthalate, polyamide, polyethersulfone, or a combination thereof, or a silicon wafer. The substrate may be omitted.

As shown, the first electrode 10 and the second electrode 20 are facing each other. One of the first electrode 10 and the second electrode 20 is an anode and the other is a cathode. In some example embodiments, the first electrode 10 may be a cathode and the second electrode 20 may be an anode. In another example, the first electrode 10 may be an anode and the second electrode 20 may be a cathode.

At least one of the first electrode 10 and the second electrode 20 may be a transparent electrode, such that the at least one of the first electrode 10 and the second electrode 20 includes a transparent conductor. Herein, the transparent electrode may include a transparent conductor having a high light transmittance of greater than or equal to about 80% and may not include for example a semi-transparent electrode for microcavity. The transparent electrode may include for example a transparent conductor that includes at least one of an oxide conductor and a carbon conductor. The oxide conductor may include for example at least one of indium tin oxide (ITO), indium zinc oxide (IZO), zinc tin oxide (ZTO), aluminum tin oxide (AITO), and aluminum zinc oxide (AZO) and the carbon conductor may at least one of graphene and carbon nanostructure.

One of the first electrode 10 and the second electrode 20 may be a reflective electrode, such that the at least one of the first electrode 10 and the second electrode 20 includes a reflective conductor. Here, the reflective electrode may include, in some example embodiments, a reflective conductor having a light transmittance of less than about 10% or high reflectance of less than or equal to about 5%. The reflective electrode may include a reflective conductor such as a metal and may include, for example aluminum (Al), silver (Ag), gold (Au), or an alloy thereof.

In some example embodiments, the first electrode 10 may be a transparent electrode (e.g., the first electrode 10 may include a transparent conductor) having a light transmittance of greater than or equal to about 80% or a reflective electrode having a light transmittance of less than about 10%.

In view of the above, it will be understood that the first electrode 10 and/or the second electrode 20 may include a conductor, where the conductor may be a transparent conductor or a reflective conductor. A conductor that is a transparent conductor may have a light transmittance of greater than or equal to about 80%. A conductor that is a reflective conductor may having a light transmittance of less than about 10%.

The photoelectric conversion layer 30, which, as shown, is between the first electrode 10 and the second electrode 20, is configured to absorb light in at least one part of a wavelength spectrum of light and convert the absorbed light into an electric signal, and for example one of light in a green wavelength spectrum of light (hereinafter, referred to as "green light"), light in a blue wavelength spectrum of light (hereinafter, referred to as "blue light"), light in a red wavelength spectrum of light (hereinafter, referred to as "red light"), light in an ultraviolet wavelength spectrum of light (hereinafter, referred to as 'ultraviolet light'), and light in an infrared wavelength spectrum of light (hereinafter, referred to as 'infrared light') into an electric signal.

In some example embodiments, the photoelectric conversion layer 30 may be configured to selectively absorb at least one of the green light, the blue light, the red light, and the infrared light. Herein, the selective absorption of at least one from the green light, the blue light, the red light, and the infrared light means that a light-absorption spectrum has a peak absorption wavelength ($\lambda_{max}$) in one of about 500 nm to about 600 nm, greater than or equal to about 380 nm and less than about 500 nm, greater than about 600 nm and less than or equal to about 700 nm, and greater than about 700 nm, and a light-absorption spectrum in the corresponding wavelength spectrum of light is remarkably higher than those in the other wavelength spectra of light.

The photoelectric conversion layer 30 may include a semiconductor material that is at least one p-type semiconductor and/or at least one n-type semiconductor, where the semiconductor material forms a pn junction with the first organic material of the photoelectric conversion layer 30 and may produce excitons by receiving light from outside and then separate the produced excitons into holes and electrons.

The p-type semiconductor and the n-type semiconductor may be independently light-absorbing materials, and for example at least one of the p-type semiconductor and the n-type semiconductor may be an organic light-absorbing material. In some example embodiments, at least one of the p-type semiconductor and the n-type semiconductor may be a wavelength-selective light-absorbing material that selectively absorbs light in a particular (or, alternatively, predetermined) wavelength spectrum of light, and for example at least one of the p-type semiconductor and the n-type semiconductor may be a wavelength-selective organic light-absorbing material. The p-type semiconductor and the n-type semiconductor may have a peak absorption wavelength ($\lambda_{max}$) in the same wavelength spectrum of light or in a different wavelength spectrum of light.

In some example embodiments, the p-type semiconductor may be an organic material having a core structure including an electron donating moiety, a pi conjugation linking group, and an electron accepting moiety.

The p-type semiconductor may be for example represented by Chemical Formula 1, but is not limited thereto.

EDG-HA-EAG    [Chemical Formula 1]

In Chemical Formula 1,

HA is a C2 to C30 heterocyclic group having at least one of S, Se, Te, and Si,

EDG is an electron-donating group, and

EAG is an electron accepting group.

In some example embodiments, the p-type semiconductor represented by Chemical Formula 1 may be for example represented by Chemical Formula 1A.

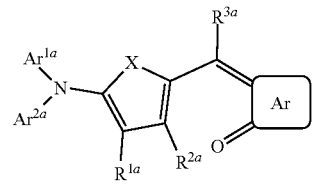

[Chemical Formula 1A]

In Chemical Formula 1A,

X may be S, Se, Te, SO, $SO_2$, or $SiR^aR^b$,

Ar may be a substituted or unsubstituted C6 to C30 arylene group, a substituted or unsubstituted C3 to C30 heterocyclic group, or a fused ring of the foregoing two or more, $Ar^{1a}$ and $Ar^{2a}$ may independently be a substituted or unsubstituted C6 to C30 aryl group or a substituted or unsubstituted C3 to C30 heteroaryl group, $Ar^{1a}$ and $Ar^{2a}$ may independently be present alone or may be linked with each other to form a fused ring, and $R^{1a}$ to $R^{3a}$, $R^a$, and $R^b$ may independently be hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

In some example embodiments, in Chemical Formula 1A, Ar1a and Ar2a may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, and a substituted or unsubstituted pyridopyridazinyl group.

In some example embodiments, $Ar^{1a}$ and $Ar^2a$ of Chemical Formula 1A may be linked with each other to form a ring or in some example embodiments, $Ar^{1a}$ and $Ar^{2a}$ may be linked with each other by one of a single bond, —($CR^g R^h$)$_{n2}$— (n2 is 1 or 2), —O—, —S—, —Se—, —N=, —$NR^i$—, —$SiR^jR^k$—, and —$GeR^lR^m$— to form a ring. Herein, $R^g$ to $R^m$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

In some example embodiments, the p-type semiconductor represented by Chemical Formula 1 may be for example represented by Chemical Formula 1B.

[Chemical Formula 1b]

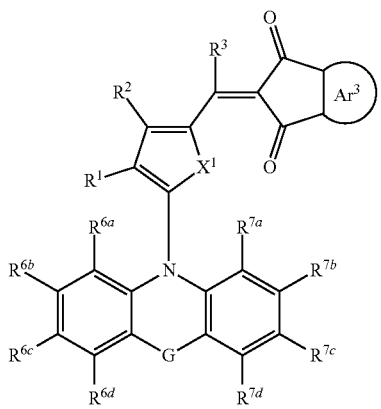

In Chemical Formula 1B, $X^1$ may be Se, Te, O, S, SO, or $SO_2$, $Ar^3$ may be a substituted or unsubstituted C6 to C30 arylene group, a substituted or unsubstituted C3 to C30 heterocyclic group, or a fused ring of the foregoing two or more, $R^1$ to $R^3$ may independently be one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, and a combination thereof, G may be one of a single bond, —O—, —S—, —Se—, —N═, —$(CR^fR^g)_k$—, —$NR^h$—, —$SiR^iR^j$—, —$GeR^kR^l$—, —$(C(R^m)$═$C(R^n))$—, and $SnR^oR^p$, wherein $R^f$, $R^g$, $R^h$, $R^i$, $R^j$, $R^k$, $R^l$, $R^m$, $R^n$, $R^o$, and $R^p$ may independently be one of hydrogen, a halogen, a substituted or unsubstituted C1 to C10 alkyl group, a substituted or unsubstituted C1 to C10 alkoxy group, and a substituted or unsubstituted C6 to C12 aryl group, $R^f$ and $R^g$, $R^i$ and $R^j$, $R^k$ and $R^l$, $R^m$ and $R^n$, and $R^o$ and $R^p$ may independently be present alone or may be linked with each other to provide a ring, and k may be 1 or 2, $R^{6a}$ to $R^{6d}$ and $R^{7a}$ to $R^{7d}$ may independently be one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, and a combination thereof, $R^{6a}$ to $R^{6d}$ may independently be present alone or adjacent two thereof may be linked with each other to form a fused ring, and $R^{7a}$ to $R^{7d}$ may independently be present alone or adjacent two thereof may be linked with each other to form a fused ring.

In some example embodiments, $Ar^3$ of Chemical Formula 1B may be benzene, naphthylene, anthracene, thiophene, selenophene, tellurophene, pyridine, pyrimidine, or a fused ring of the foregoing two or more.

The n-type semiconductor may be for example fullerene or a fullerene derivative, but is not limited thereto.

The photoelectric conversion layer 30 may be an intrinsic layer (an I layer) wherein the p-type semiconductor and the n-type semiconductor are mixed as a bulk heterojunction. Herein, the p-type semiconductor and the n-type semiconductor may be mixed in a volume ratio of about 1:9 to about 9:1, for example about 2:8 to about 8:2, about 3:7 to about 7:3, about 4:6 to about 6:4, or about 5:5.

The photoelectric conversion layer 30 may be a bilayer including a p-type layer including the p-type semiconductor and an n-type layer including the n-type semiconductor. Herein, a thickness ratio of the p-type layer and the n-type layer may be about 1:9 to about 9:1, for example about 2:8 to about 8:2, about 3:7 to about 7:3, about 4:6 to about 6:4, or about 5:5.

The photoelectric conversion layer 30 may further include a p-type layer and/or an n-type layer in addition to the intrinsic layer. The p-type layer may include the p-type semiconductor and the n-type layer may include the n-type semiconductor. In some example embodiments, they may be included in various combinations of p-type layer/I layer, I layer/n-type layer, p-type layer/I layer/n-type layer, and the like.

The organic auxiliary layer 40 may be disposed between the first electrode 10 and the photoelectric conversion layer 30 and may be for example in contact with the photoelectric conversion layer 30. One surface of the organic auxiliary layer 40 may be in contact with the first electrode 10 and the other surface of the organic auxiliary layer 40 may be in contact with the photoelectric conversion layer 30. The organic auxiliary layer 40 may include the semiconductor material included in the photoelectric conversion layer, such that the organic auxiliary layer 40 includes the p-type semiconductor and/or the n-type semiconductor. It will be understood that, in some example embodiments, the inorganic nanolayer 40 may not be in contact with the first electrode 10.

The organic auxiliary layer 40 is a layer configured to effectively improve the extraction of charges (e.g., electrons) moving from the photoelectric conversion layer 30 to the first electrode 10, and may include for example an organic semiconductor having a high charge mobility.

In some example embodiments, the charge mobility of the organic auxiliary layer 40 may be higher than the charge mobility of the photoelectric conversion layer 30. In some example embodiments, the charge mobility of the organic auxiliary layer 40 may be at least about 50 times, for example at least about 70 times, at least about 80 times, at least about 100 times, at least about 120 times, at least about 150 times, or at least about 200 times as high as the charge mobility of the photoelectric conversion layer 30.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

In some example embodiments, the charge mobility of the organic auxiliary layer 40 may be for example greater than or equal to about $1.0 \times 10^{-3}$ $cm^2/Vs$, greater than or equal to about $1.2 \times 10^{-3}$ $cm^2/Vs$, greater than or equal to about $1.5 \times 10^{-3}$ $cm^2/Vs$, greater than or equal to about $1.8 \times 10^{-3}$ $cm^2/Vs$, greater than or equal to about $2.0 \times 10^{-3}$ $cm^2/Vs$, greater than or equal to about $3.0 \times 10^{-3}$ $cm^2/Vs$, greater than or equal to about $4.0 \times 10^{-3}$ $cm^2/Vs$, or greater than or equal to about $5.0 \times 10^{-3}$ $cm^2/Vs$.

In some example embodiments, the charge mobility of the organic auxiliary layer 40 may be for example about $1.0 \times 10^{-3}$ $cm^2/Vs$ to about 10 $cm^2/Vs$, about $1.2 \times 10^{-3}$ $cm^2/Vs$ to about 10 $cm^2/Vs$, about $1.5 \times 10^{-3}$ $cm^2/Vs$ to about 10 $cm^2/Vs$, about $1.8 \times 10^{-3}$ $cm^2/Vs$ to about 10 $cm^2/Vs$, about $2.0 \times 10^{-3}$ $cm^2/Vs$ to about 10 $cm^2/Vs$, about $3.0'10^{-3}$ $cm^2/Vs$ to about 10 cm²/Vs, about 4.0×10⁻³ cm²/Vs to about 10 cm²/Vs, or about 5.0×10⁻³ cm²/Vs to about 10 cm²/Vs.

In some example embodiments, the photoelectric conversion layer 30 may include a first organic material that is the p-type semiconductor or the n-type semiconductor and the organic auxiliary layer 40 may include a second organic material that is different from the first organic material. In some example embodiments, the photoelectric conversion layer 30 may include a first organic material that is a p-type semiconductor and the organic auxiliary layer 40 may include a second organic material that is an n-type semiconductor. A charge mobility of the second organic material may be at least 50 times, at least about 70 times, at least about 80 times, at least about 100 times, at least about 120 times, at least about 150 times, or at least about 200 times as high as a charge mobility of the first organic material.

In some example embodiments, the charge mobility of the second organic material may be for example greater than or equal to about 1.0×10⁻³ cm²/Vs, greater than or equal to about 1.2×10⁻³ cm²/Vs, greater than or equal to about 1.5×10⁻³ cm²/Vs, greater than or equal to about 1.8×10⁻³ cm²/Vs, greater than or equal to about 2.0×10⁻³ cm²/Vs, greater than or equal to about 3.0×10⁻³ cm²/Vs, greater than or equal to about 4.0×10⁻³ cm²/Vs, or greater than or equal to about 5.0×10⁻³ cm²/Vs.

In some example embodiments, the charge mobility of the second organic material may be for example about 1.0×10⁻³ cm²/Vs to about 10 cm²/Vs, about 1.2×10⁻³ cm²/Vs to about 10 cm²/Vs, about 1.5×10⁻³ cm²/Vs to about 10 cm²/Vs, about 1.8×10⁻³ cm²/Vs to about 10 cm²/Vs, about 2.0×10⁻³ cm²/Vs to about 10 cm²/Vs, about 3.0'10⁻³ cm²/VS to about 10 cm²/Vs, about 4.0×10⁻³ cm²/Vs to about 10 cm²/Vs, or about 5.0'10⁻³ cm²/Vs to about 10 cm²/Vs.

In some example embodiments, the second organic material may be a material which satisfies the above-described charge mobility and may be formed by thermal evaporation. Since the organic auxiliary layer 40 is formed by thermal evaporation as described above, it is possible to prevent the photoelectric conversion layer 30 from being thermally and physically damaged in its formation process and/or the subsequent process of the organic auxiliary layer 40, and thus to prevent its performance from being deteriorated due to degradation of the photoelectric conversion layer 30.

The second organic material that may satisfy such characteristics may be, in some example embodiments, a low molecular organic semiconductor, a polymer semiconductor, or a combination thereof, in some example embodiments, a low molecular organic semiconductor. Herein, the low molecular organic semiconductor may be an organic semiconductor having an average molecular weight of less than or equal to about 3000.

In some example embodiments, the second organic material may include a second organic material compound that may be an aromatic compound and/or a heteroaromatic compound, for example a fused polycyclic aromatic compound, a fused polycyclic heteroaromatic compound, or a combination thereof, for example a fused polycyclic aromatic compound such as pentacene and/or a fused polycyclic heteroaromatic compound including at least one of O, S, Se, Te, N, or a combination thereof, for example a fused polycyclic heteroaromatic compound including S, Se, Te, or a combination thereof.

In some example embodiments, the second organic material may include a second organic material compound that may be a fused polycyclic aromatic compound and/or fused polycyclic heteroaromatic compound having a compact planar structure wherein four or more rings are fused with each other, for example a fused polycyclic aromatic compound and/or a fused polycyclic heteroaromatic compound wherein 5, 6, 7, 8, 9, 10, 11, or 12 rings are condensed. Restated, the second organic material may include a second organic material compound that includes at least four rings that are fused.

In some example embodiments, the second organic material may be a fused polycyclic aromatic compound and/or a fused polycyclic heteroaromatic compound including at least one benzene ring.

In some example embodiments, the second organic material may be a fused polycyclic heteroaromatic compound including at least one thiophene, selenophene, and/or tellurophene.

In some example embodiments, the second organic material may be represented by Chemical Formula 2A or 2B, but is not limited thereto.

[Chemical Formula 2A]

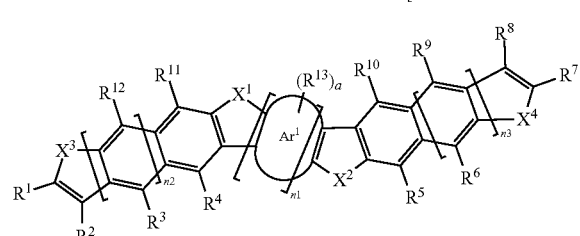

[Chemical Formula 2B]

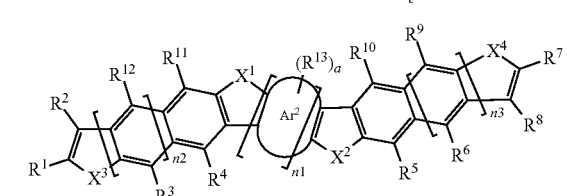

In Chemical Formulae 2A and 2B,

Ar¹ and Ar² may independently be a substituted or unsubstituted benzene, a substituted or unsubstituted naphthalene, or a substituted or unsubstituted anthracene, a may correspond to the number of hydrogen bound to carbon of Ar¹ and Ar², X¹ to X⁴ may independently be O, S, Se, Te, or N—R$^a$, wherein R$^a$ may independently be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C7 to C30 arylalkyl group, a substituted or unsubstituted C6 to C30 aryl group, a substituted or unsubstituted C1 to C30 alkoxy group, a substituted or unsubstituted C6 to C30 aryloxy group (—OR$^b$, wherein R$^b$ is a substituted or unsubstituted C6 to C30 aryl group), a substituted or unsubstituted C4 to C30 cycloalkyl group, a substituted or unsubstituted C4 to C30 cycloalkyloxy group (—OR$^c$, wherein R$^c$ is a substituted or unsubstituted C4 to C30 cycloalkyl group), a substituted or unsubstituted C2 to C30 heteroaryl group, acyl group (—C(=O)R$^d$, wherein R$^d$ is a substituted or unsubstituted C1 to C30 alkyl group), a sulfonyl group (—S(=O)₂R$^e$, wherein R$^e$ is a substituted or unsubstituted C1 to C30 alkyl group), or carbamate group (—NHC(=O)OR$^f$, wherein R$^f$ is a substituted or unsubstituted C1 to C30 alkyl group), R¹ to R¹³ may independently be hydrogen, a substituted or unsubstituted C1 to C30 alkyl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group, n1 may be 0 or 1,
n2 and n3 may independently be 0, 1, 2, or 3,
when n1 is 0, n2 and n3 may be 1, 2, or 3, and
when n1 is 1, n1+n2+n3≥2.

In some example embodiments, $R^1$ and $R^7$ may be a substituted or unsubstituted C1 to C30 alkyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group.

In some example embodiments, $R^a$ may be a substituted or unsubstituted C10 to C30 alkyl group, a substituted or unsubstituted C10 to C30 alkoxy group, a substituted or unsubstituted C10 to C30 alkenyl group, or a substituted or unsubstituted C10 to C30 alkynyl group, and for another example, a fluoro substituted C1 to C30 alkyl group, desirably a C1 to C30 perfluoro alkyl group ($C_nF_{2n+1}$, wherein n is an integer of 1 or greater) or a fluoro substituted C10 to C30 alkyl group, desirably a C10 to C30 perfluoro alkyl group ($C_nF_{2n+1}$, wherein n is an integer of 10 to).

In Chemical Formulae 2A and 2B, when n1 is 0, n2 and n3 may be an integer of 1, 2, or 3 and when n1 is 1, n1+n2+n3≥2, for example when n1 is 1, both n2 and n3 may not be 0.

The second organic material may be for example one of compounds of Group 1, but is not limited thereto.

[Group 1]

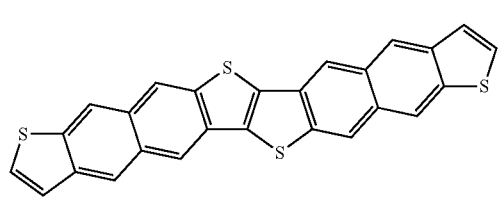

(1)

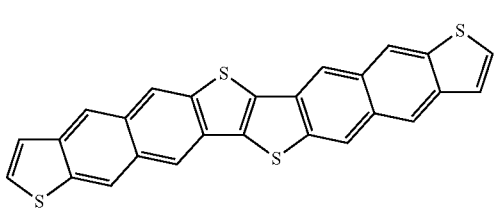

(2)

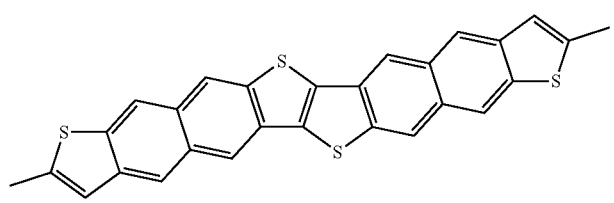

(1a)

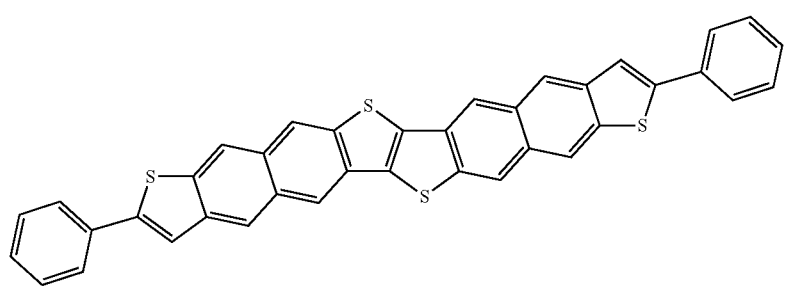

(1b)

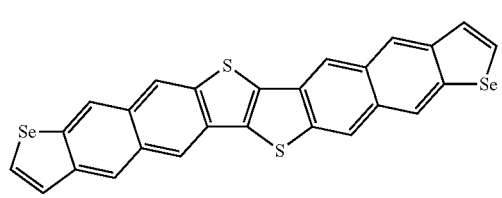

(3)

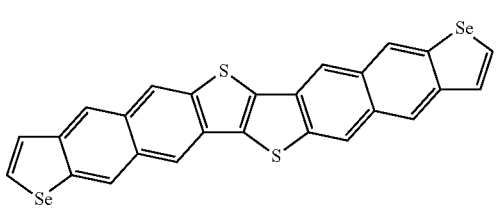

(4)

-continued
(5)
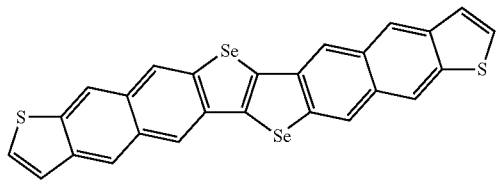
(6)
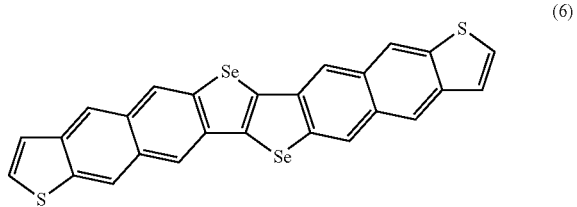
(7)
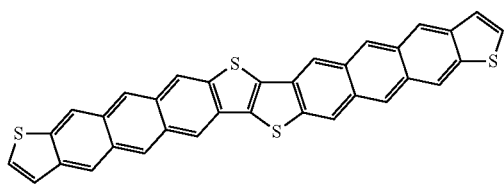
(8)
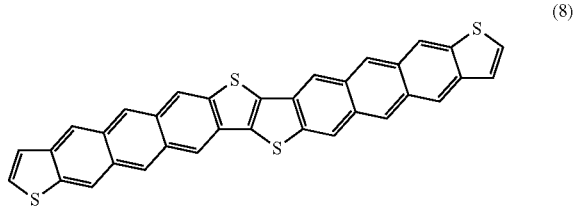
(9)
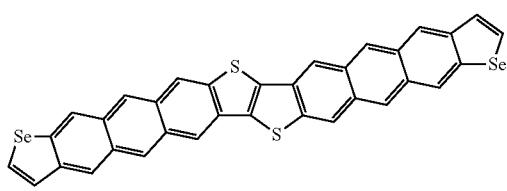
(10)
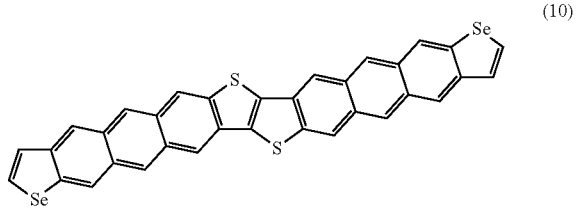
(11)
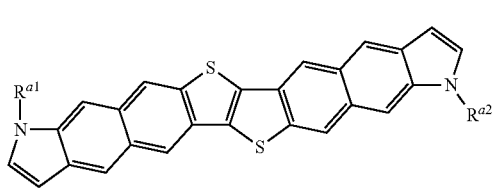
(12)
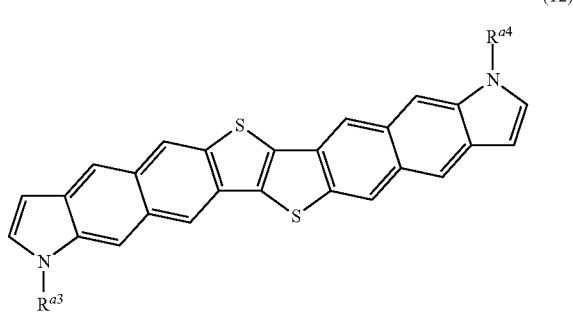
(13)
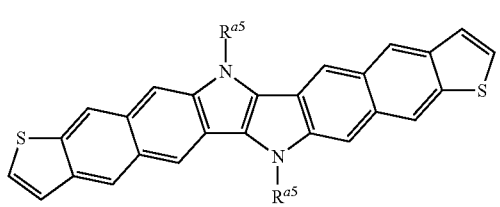
(14)
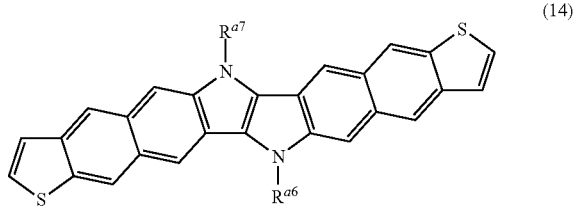
(15)
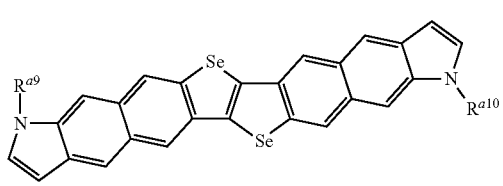
(16)
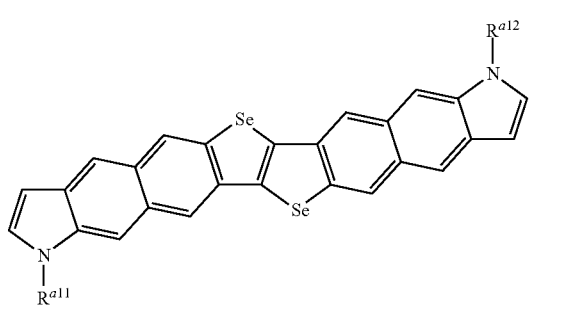

-continued
(17)
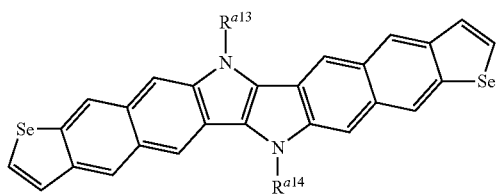
(18)
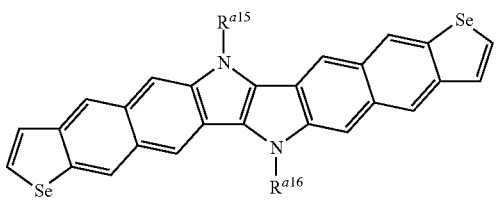
(19)
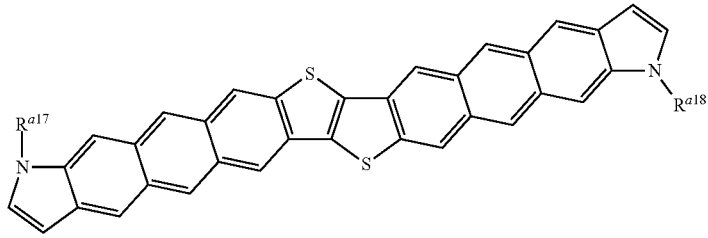
(20)
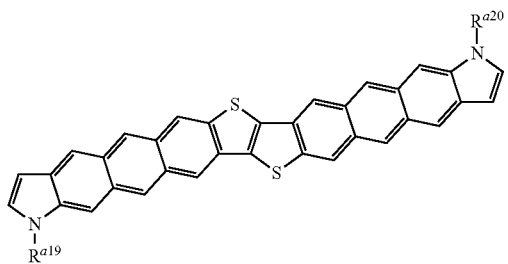
(21)
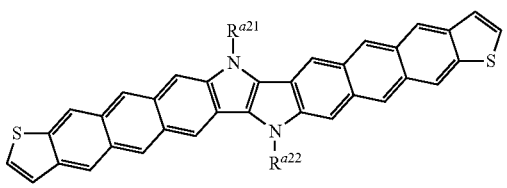
(22)
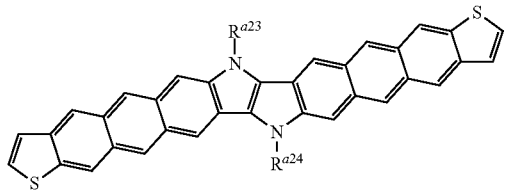
(23)
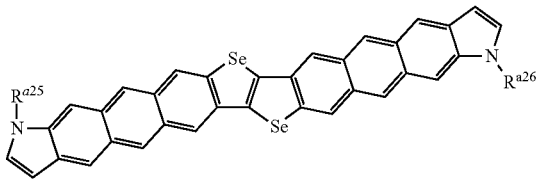
(24)
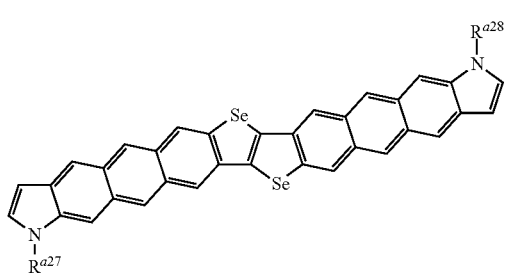
(25)
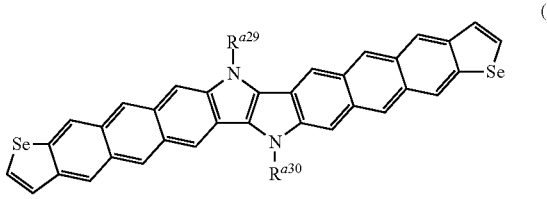
(26)
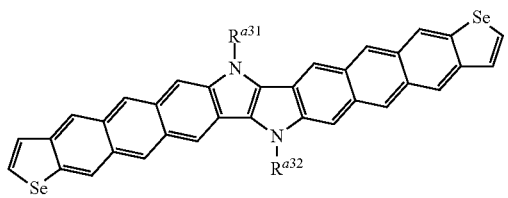
(27)
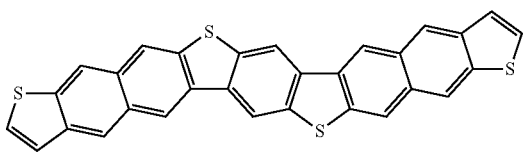
(28)
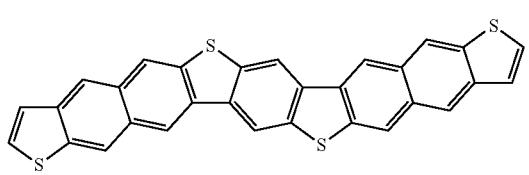
(29)
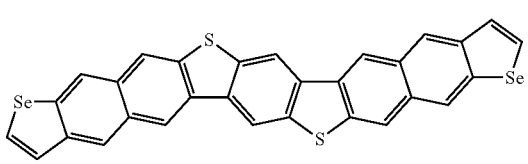

-continued
(30)
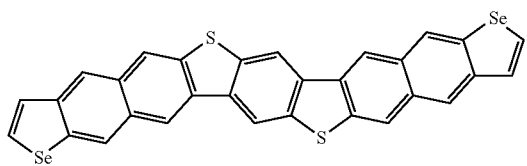
(31)
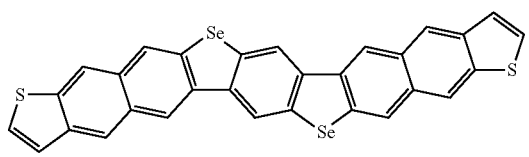
(32)
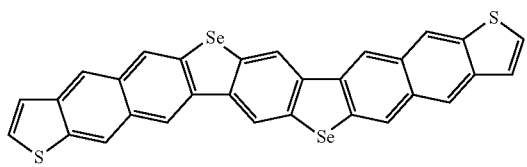
(33)
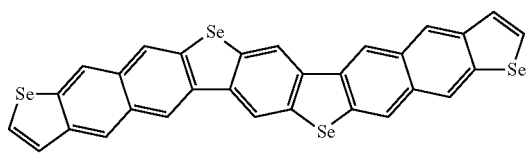
(34)
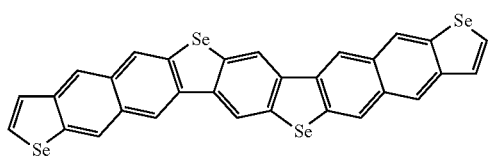
(35)
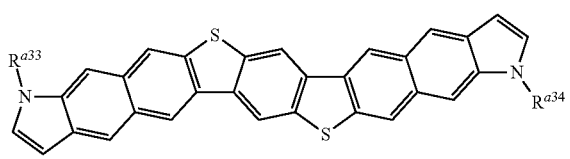
(36)
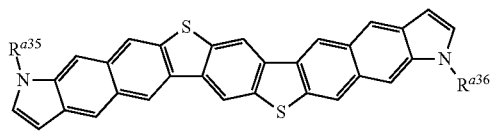
(37)
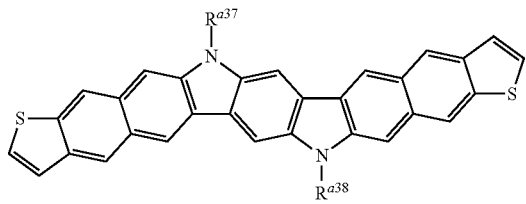
(38)
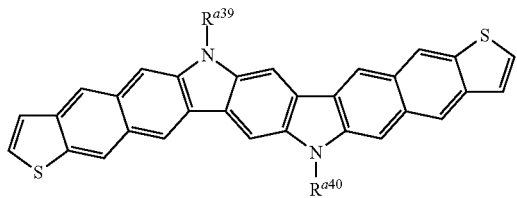
(39)
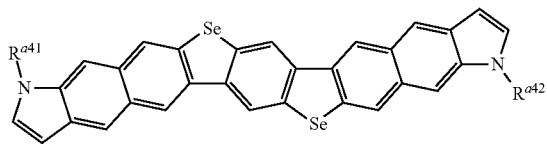
(40)
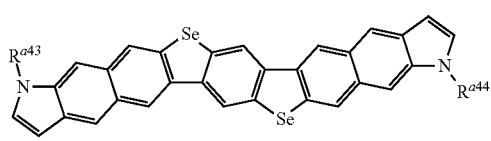
(41)
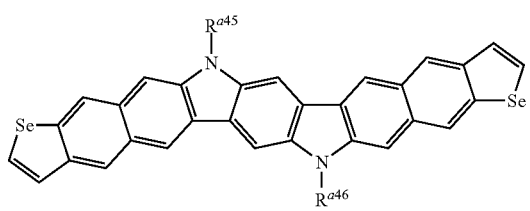
(42)
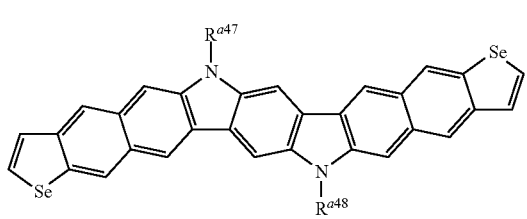

-continued
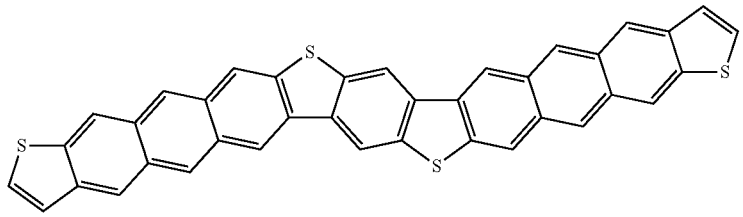
(43)
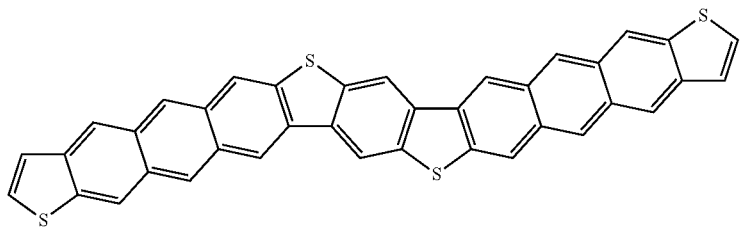
(44)
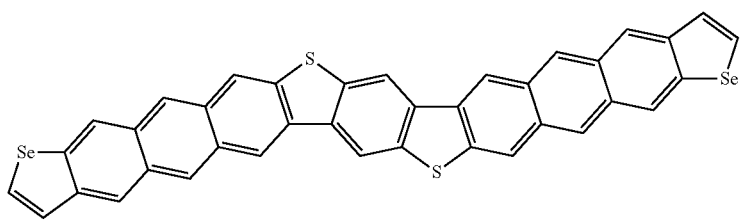
(45)
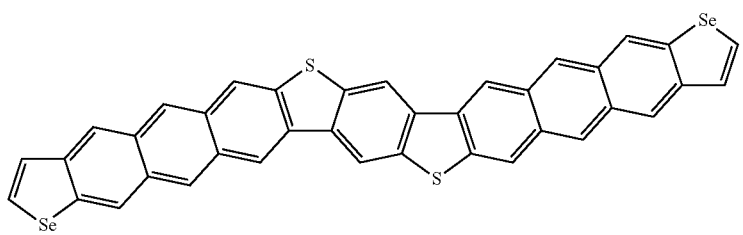
(46)
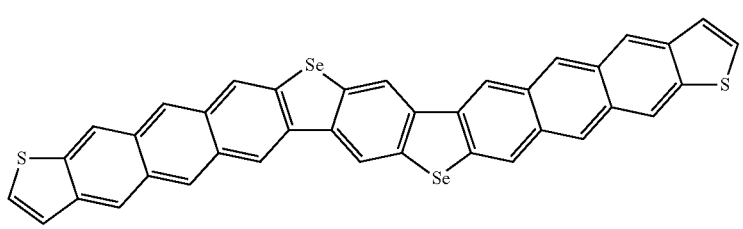
(47)
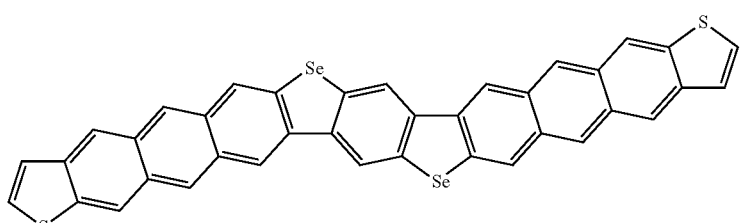
(48)
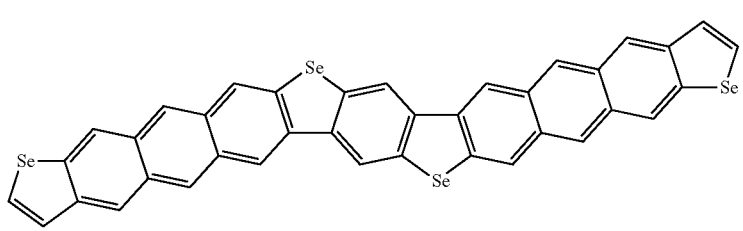
(49)

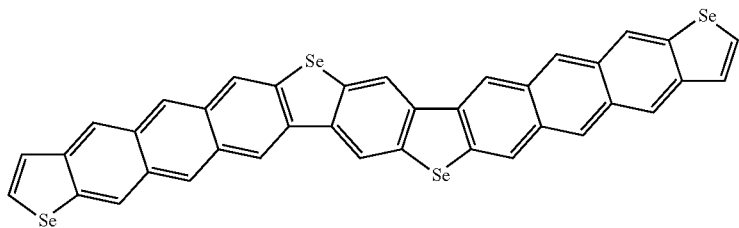
(50)
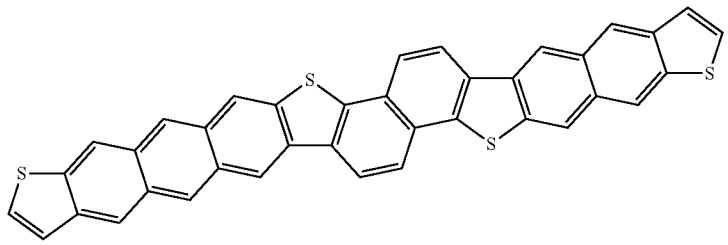
(51)
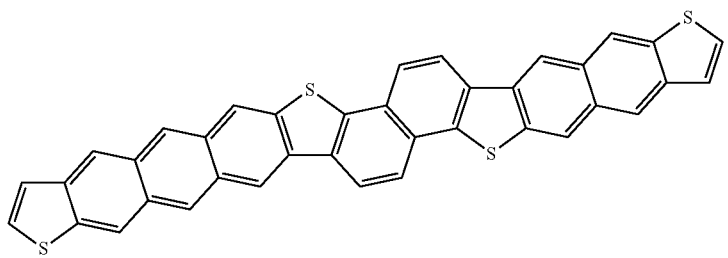
(52)
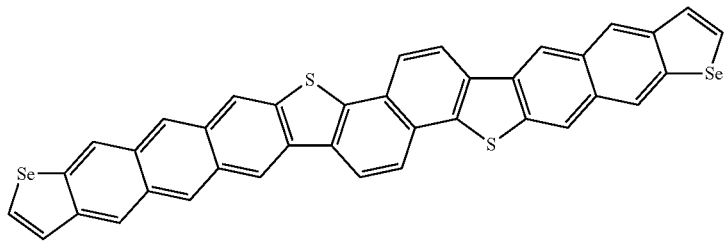
(53)
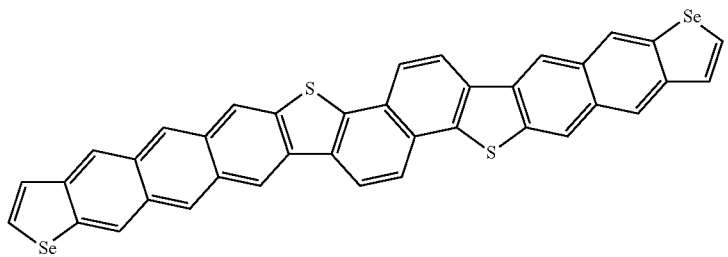
(54)
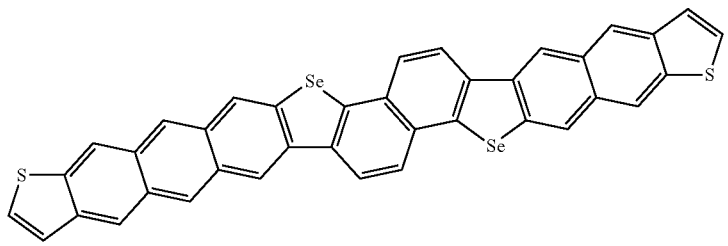
(55)

-continued
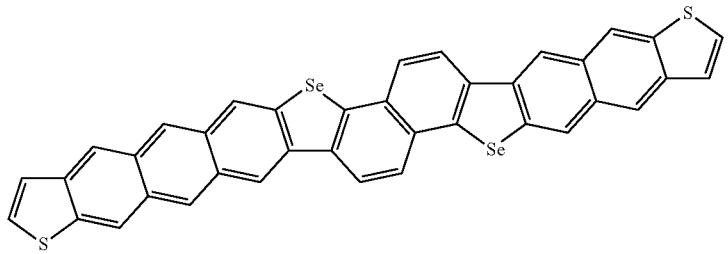
(56)
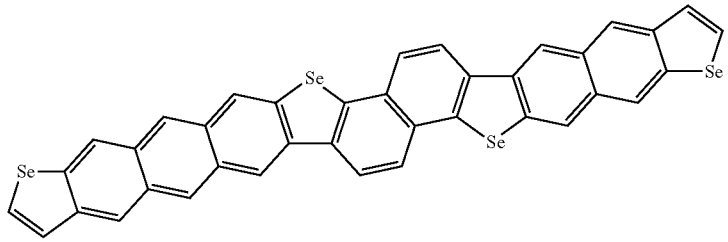
(57)
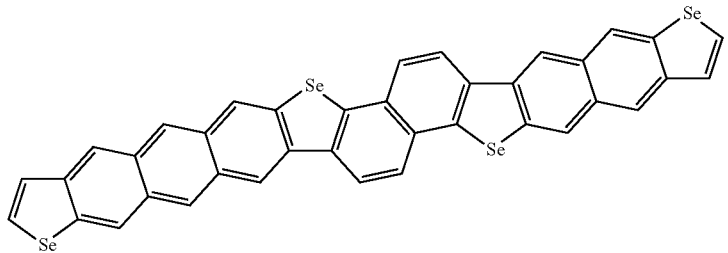
(58)
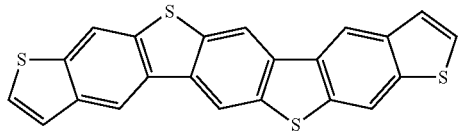
(59)
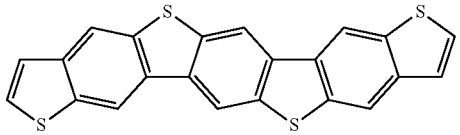
(60)
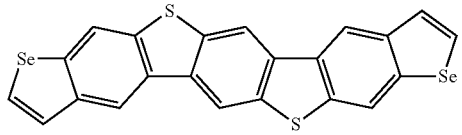
(61)
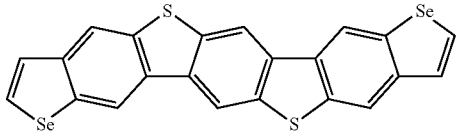
(62)
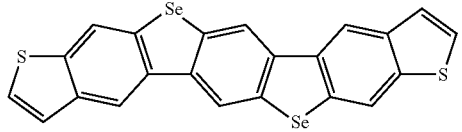
(63)
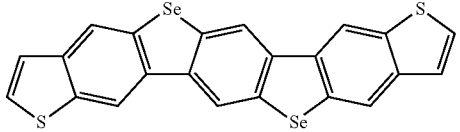
(64)
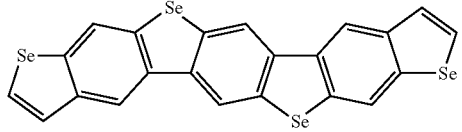
(65)
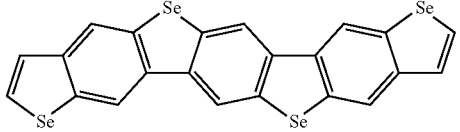
(66)
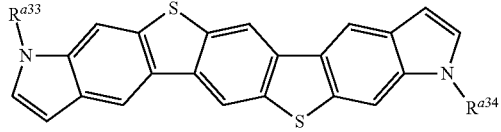
(67)
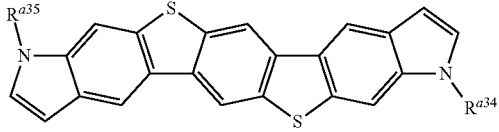
(68)

| (69) | (70) |
|---|---|
| 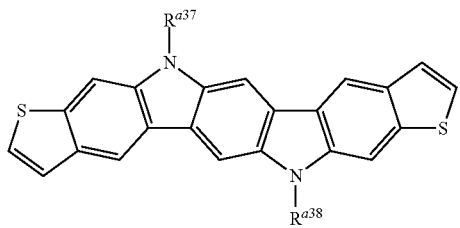 | 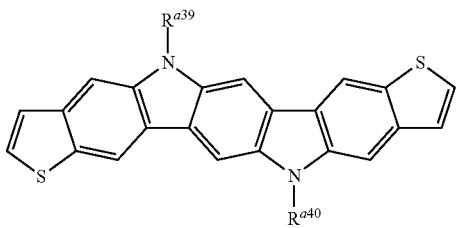 |
| (71) | (72) |
| 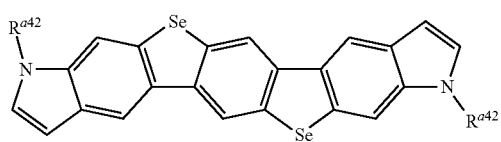 | 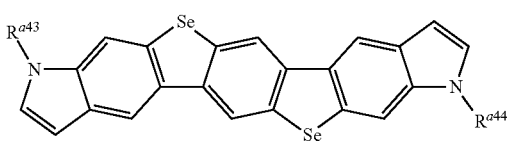 |
| (73) | (74) |
| 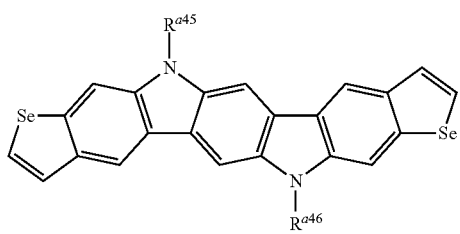 | 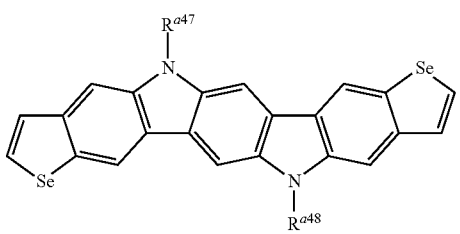 |
| (75) | (76) |
| 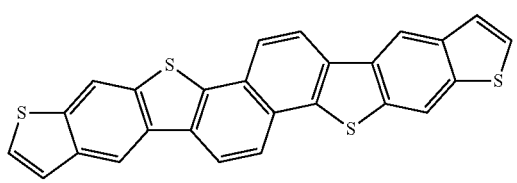 | 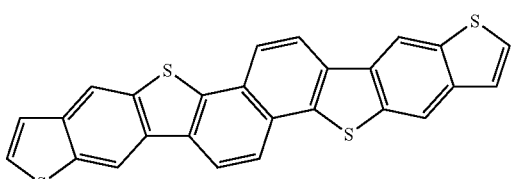 |
| (77) | (78) |
| 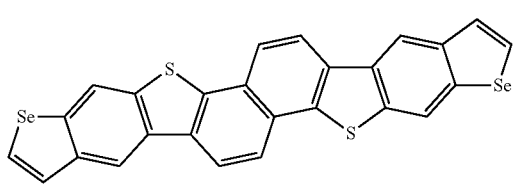 | 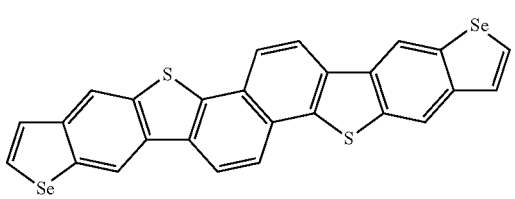 |
| (79) | (80) |
| 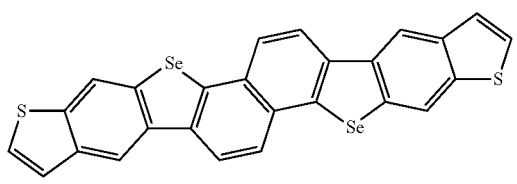 | 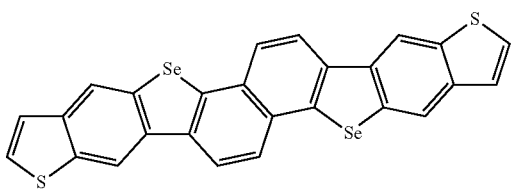 |
| (81) | (82) |
| 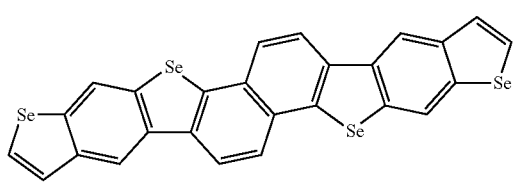 | 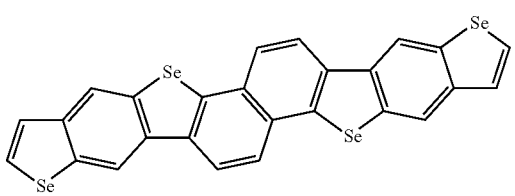 |

In the compounds of Group 1, hydrogen of each benzene, thiophene, sellenophene, and/or pyrrole may be may be replaced by a substituted or unsubstituted C1 to C30 alkyl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group.

In some example embodiments, the second organic material may be represented by Chemical Formula 3A or 3B, but is not limited thereto.

[Chemical Formula 3A]

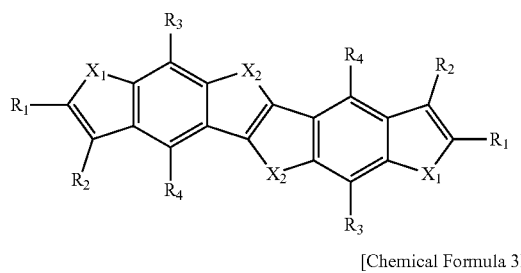

[Chemical Formula 3B]

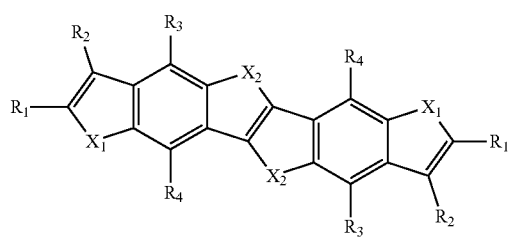

In Chemical Formulae 3A and 3B, $X^1$ and $X^2$ may independently be O, S, Se, Te, or N—$R^a$, wherein $R^a$ may be hydrogen, a substituted or unsubstituted C1 to C12 alkyl group, a substituted or unsubstituted C6 to C30 arylalkyl group, a substituted or unsubstituted C6 to C30 aryl group, a substituted or unsubstituted C1 to C12 alkoxy group, a substituted or unsubstituted C1 to C30 acyl group, a sulfonyl group, or a carbamate group, and $R^1$ to $R^4$ may independently be hydrogen, a substituted or unsubstituted C1 to C30 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C6 to C30 arylalkyl group, a substituted or unsubstituted C2 to C30 heteroarylalkyl group, a substituted or unsubstituted C5 to C20 cycloalkyl group, a substituted or unsubstituted C2 to C30 heterocycloalkyl group, a substituted or unsubstituted C6 to C30 aryl group, or a substituted or unsubstituted C2 to C30 heteroaryl group.

The organic semiconductor material represented by Chemical Formula 3A may be for example represented by Chemical Formula 3A-1 and the organic semiconductor material represented by Chemical Formula 3B may be for example represented by Chemical Formula 3B-1.

[Chemical Formula 3A-1]

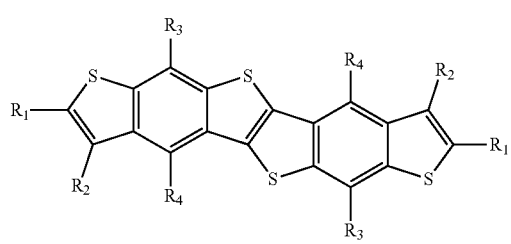

[Chemical Formula 3B-1]

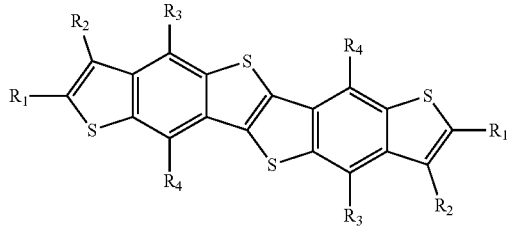

In Chemical Formulae 3A-1 and 3B-1, $R^1$ to $R^4$ are the same as described above.

In some example embodiments, the second organic material may be for example one of compounds of Group 2, but is not limited thereto.

[Group 2]

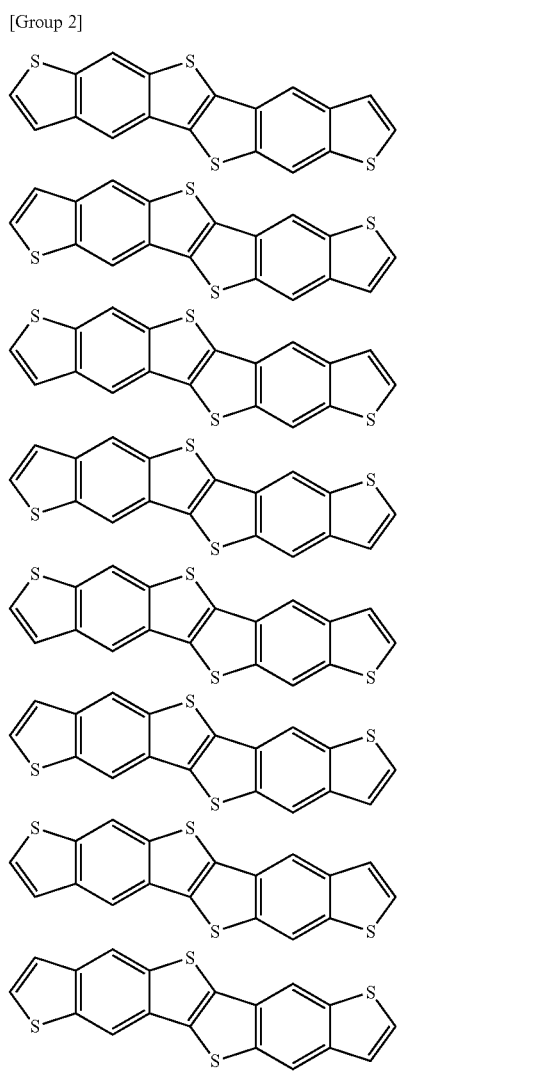

In the compounds of Group 2, hydrogen of each benzene and/or thiophene may be may be replaced by a substituted or unsubstituted C1 to C30 alkyl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group.

In some example embodiments, the organic auxiliary layer 40 may further include an organic material, an inorganic material, and/or an organic/inorganic material in addition to the second organic material.

In some example embodiments, the organic auxiliary layer 40 may further include the p-type semiconductor and/or the n-type semiconductor included in the photoelectric conversion layer 30.

In some example embodiments, the organic auxiliary layer 40 may further include the semiconductor, which may be the p-type semiconductor, in the photoelectric conversion layer 30. In some example embodiments, the second organic material and the p-type semiconductor may be mixed. The second organic material and the p-type semiconductor may be mixed in a volume ratio of about 1:9 to about 9:1, for example about 2:8 to about 8:2, about 3:7 to about 7:3, about 4:6 to about 6:4, or about 5:5.

In some example embodiments, the organic auxiliary layer 40 may further include the semiconductor, which may be the n-type semiconductor, in the photoelectric conversion layer 30. In some example embodiments, the second organic material and the n-type semiconductor may be mixed. The second organic material and the n-type semiconductor may be mixed in a volume ratio of about 1:9 to about 9:1, for example about 2:8 to about 8:2, about 3:7 to about 7:3, about 4:6 to about 6:4, or about 5:5.

In some example embodiments, the organic auxiliary layer 40 may further include the p-type semiconductor and the n-type semiconductor in the photoelectric conversion layer 30. In some example embodiments, the second organic material and the p-type semiconductor/n-type semiconductor may be mixed. The second organic material and the p-type semiconductor/the n-type semiconductor may be mixed in a volume ratio of about 1:9 to about 9:1, for example about 2:8 to about 8:2, about 3:7 to about 7:3, about 4:6 to about 6:4, or about 5:5.

In some example embodiments, the semiconductor, which may be included in the organic auxiliary layer 40 and which may include the p-type semiconductor and/or the n-type semiconductor, may further include fullerene or a fullerene derivative. In some example embodiments, the second organic material and the fullerene or fullerene derivative may be mixed. The second organic material and the fullerene or fullerene derivative may be mixed in a volume ratio of about 1:9 to about 9:1, for example about 2:8 to about 8:2, about 3:7 to about 7:3, about 4:6 to about 6:4, or about 5:5.

The organic auxiliary layer 40 may be thinner than the photoelectric conversion layer 30 and may have, for example a thickness of less than or equal to about 10 nm, or less than or equal to about 5 nm. In some example embodiments, the organic auxiliary layer 40 may have a thickness of about 1 nm to about 10 nm, or 1 nm to about 5 nm.

As described above, the photoelectric conversion device 100 includes the organic auxiliary layer 40 between the first electrode 10 and the photoelectric conversion layer 30, so that extraction of charges (e.g., electrons) transferred from the photoelectric conversion layer 30 to the first electrode 10 may be effectively increased to reduce remaining charge carriers and to exhibit high charge extraction efficiency. Accordingly, it is possible to enhance the photoelectric conversion efficiency of the photoelectric conversion device 100 and to reduce an image lag which may be caused by remaining charge carriers, thereby effectively improving the after-image characteristics, thereby improving the performance of an organic sensor that includes the photoelectric conversion device 100.

The photoelectric conversion device 100 may further include an anti-reflection layer (not shown) on one surface of the first electrode 10 or the second electrode 20. The anti-reflection layer is disposed at a light incidence side and lowers reflectance of light of incident light and thereby light absorbance is further improved. In some example embodiments, when light is incident to the first electrode 10, the anti-reflection layer may be disposed on one surface of the first electrode 10, and when light is incident to the second electrode 20, anti-reflection layer may be disposed on one surface of the second electrode 20.

The anti-reflection layer may include, for example a material having a refractive index of about 1.6 to about 2.5, and may include for example at least one of metal oxide, metal sulfide, and an organic material having a refractive index within the ranges. The anti-reflection layer may include, for example a metal oxide such as aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxide, chromium-containing oxide, tellurium-containing oxide, or a combination thereof; metal sulfide such as zinc sulfide; or an organic material such as an amine derivative, but is not limited thereto.

In the photoelectric conversion device 100, when light enters from the first electrode 10 or the second electrode 20 and the photoelectric conversion layer 30 absorbs light in a particular (or, alternatively, predetermined) wavelength spectrum of light, excitons may be produced thereinside. The excitons are separated into holes and electrons in the photoelectric conversion layer 30, and the separated holes are transported to an anode that is one of the first electrode 10 and the second electrode 20 and the separated electrons are transported to the cathode that is the other of the first electrode 10 and the second electrode 20 so as to flow a current.

Hereinafter, a photoelectric conversion device according to some example embodiments is described.

Figure 2:
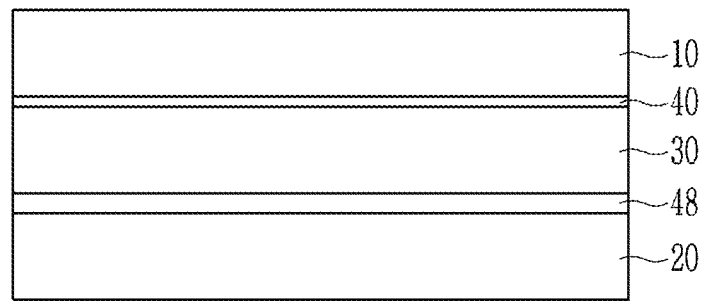
FIG. 2 is a cross-sectional view showing an example of a photoelectric conversion device according to some example embodiments.

FIG. 2 is a cross-sectional view showing an example of a photoelectric conversion device according to some example embodiments.

Referring to FIG. 2, a photoelectric conversion device 200 according to some example embodiments includes a first electrode 10, a second electrode 20, a photoelectric conversion layer 30, and an organic auxiliary layer 40.

However, the photoelectric conversion device 200 according to some example embodiments includes a charge blocking layer 48 between the second electrode 20 and the photoelectric conversion layer 30. The charge blocking layer 48 may enhance photoelectric conversion efficiency by blocking charges (e.g., electrons) separated from the photoelectric conversion layer 30 from moving to the opposed electrode.

The charge blocking layer 48 may include, for example an organic material, an inorganic material, or an organic/inorganic material. The organic material may be an organic compound having hole or electron characteristics and the inorganic material may be, for example metal oxide such as molybdenum oxide, tungsten oxide, or nickel oxide.

The charge blocking layer 48 may include for example a visible light non-absorbing material that does not absorb light in a visible region substantially, for example a visible light non-absorbing organic material.

In some example embodiments, the visible light non-absorbing material may be a compound represented by Chemical Formula 4A or 4B, but is not limited thereto.

[Chemical Formula 4A]

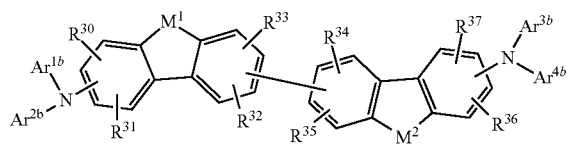

[Chemical Formula 4B]

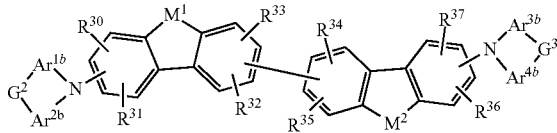

In Chemical Formula 4A or 4B, $M^1$ and $M^2$ may independently be $CR''R^o$, $SiR^pR^q$, $NR^r$, O, S, Se, or Te, $Ar^{1b}$, $Ar^{2b}$, $Ar^{3b}$, and $Ar^{4b}$ may independently be a substituted or unsubstituted C6 to C30 aryl group or a substituted or unsubstituted C3 to C30 heteroaryl group, $G^2$ and $G^3$ may independently be a single bond, —$(CR^s R^t)_{n3}$—, —O—, —S—, —Se—, —N=, —$NR^u$—, —$SiR'R^w$—, or —$GeR^xR^y$—, wherein n3 is 1 or 2, and $R^{30}$ to $R^{37}$ and $R''$ to $R^y$ may independently be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

In some example embodiments, the visible light non-absorbing material may be a compound represented by Chemical Formula 4A-1 or 4B-1, but is not limited thereto.

[Chemical Formula 4A-1]

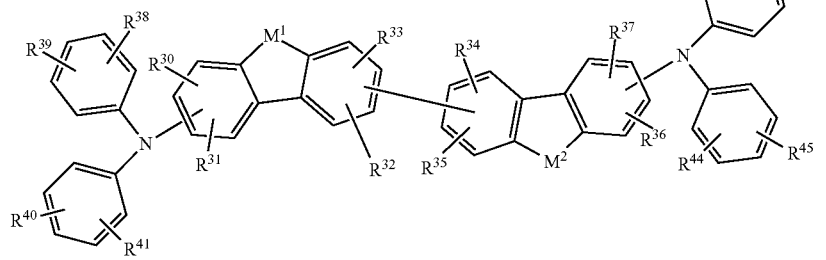

[Chemical Formula 4B-1]

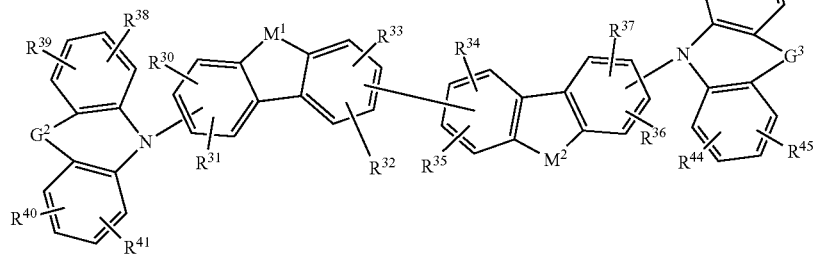

In Chemical Formula 4A-1 or 4B-1, $M^1$, $M^2$, $G^2$, $G^3$, and $R^{30}$ to $R^{37}$ are the same as described above, and $R^{38}$ to $R^{45}$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

In some example embodiments, the visible light non-absorbing material may be a compound represented by Chemical Formula 4A-1a or 4B-1a, but is not limited thereto.

and may be for example in contact with the first electrode 10. In some example embodiments, the organic auxiliary layer 40 may be in contact with the photoelectric conversion layer 30, the inorganic nanolayer 45 may be in contact with the first electrode 10, and the organic auxiliary layer 40 and the inorganic nanolayer 45 may be in contact with each other.

The inorganic nanolayer 45 may be a very thin film of a several nanometers in thickness and may have a thickness of, in some example embodiments, less than or equal to about 5 nm, less than or equal to about 3 nm, or less than or equal to about 2 nm. The inorganic nanolayer 45 may have,

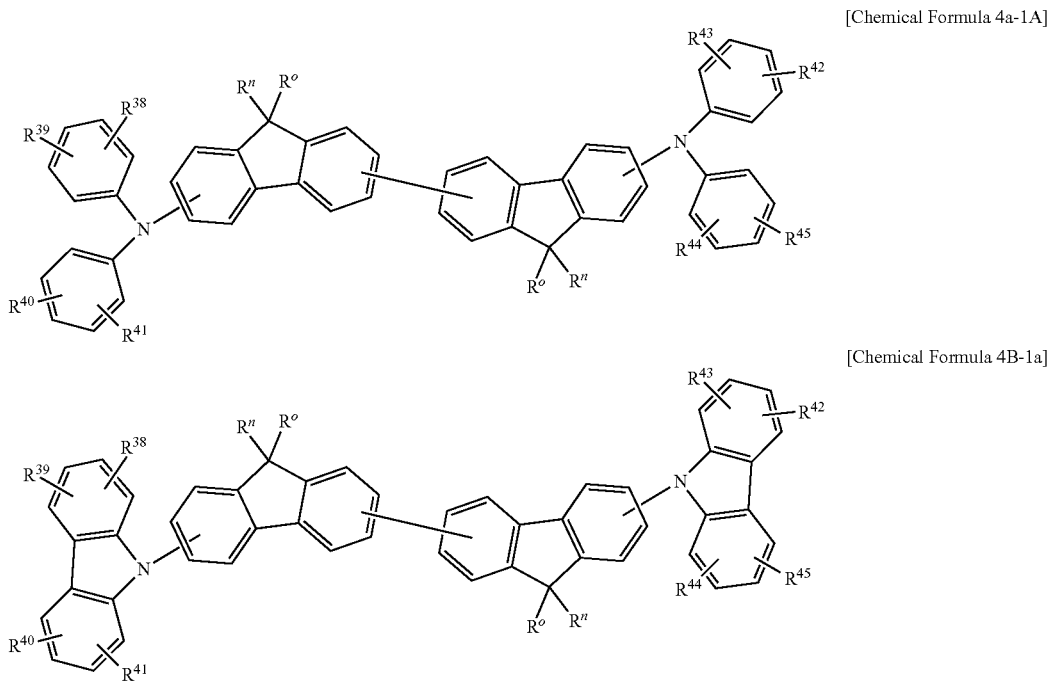

[Chemical Formula 4a-1A]

[Chemical Formula 4B-1a]

In Chemical Formula 4A-1a or 4B-1a, $R^{38}$ to $R^{45}$ and $R^o$ and $R^n$ are the same as described above.

The photoelectric conversion device 200 according to some example embodiments further includes the charge blocking layer 48 between the second electrode 20 and the photoelectric conversion layer 30 in addition to the organic auxiliary layer 40 between the first electrode 10 and the photoelectric conversion layer 30, and thereby holes and electrons separated from the photoelectric conversion layer 30 may be transferred to each anode and cathode efficiently to further increase charge extraction efficiency.

Hereinafter, a photoelectric conversion device according to some example embodiments is described.

Figure 3:
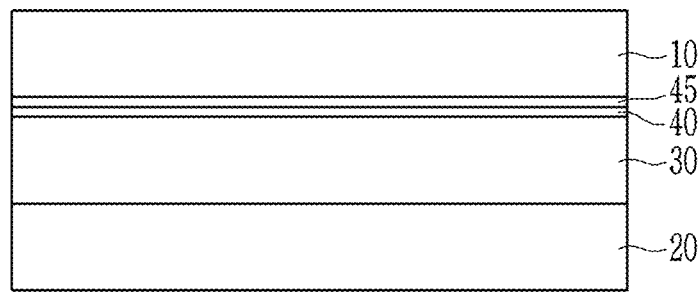
FIG. 3 is a cross-sectional view showing an example of a photoelectric conversion device according to some example embodiments.

FIG. 3 is a cross-sectional view showing an example of a photoelectric conversion device according to some example embodiments.

Referring to FIG. 3, a photoelectric conversion device 300 according to some example embodiments includes a first electrode 10, a second electrode 20, a photoelectric conversion layer 30, and an organic auxiliary layer 40.

In some example embodiments, including the example embodiments shown in FIG. 3, the photoelectric conversion device 300 further includes an inorganic nanolayer 45.

The inorganic nanolayer 45 may be disposed between the first electrode 10 and the photoelectric conversion layer 30, for example a thickness of about 1 nm to about 5 nm, about 1 nm to about 3 nm, or about 1 nm to about 2 nm.

The inorganic nanolayer 45 may include an inorganic material having a lower work function than the first electrode 10. In some example embodiments, a work function of the inorganic nanolayer 45 may be less than a work function of the first electrode 10 by greater than or equal to about 0.5 eV. In some example embodiments, the work function of the first electrode 10 may be greater than or equal to about 4.5 eV and the work function of the inorganic nanolayer 45 may be less than or equal to about 4.0 eV. In some example embodiments, the work function of the first electrode 10 may be greater than or equal to about 4.5 eV and the work function of the inorganic nanolayer 45 may be less than or equal to about 3.5 eV. In some example embodiments, the work function of the first electrode 10 may be greater than or equal to about 4.5 eV and the work function of the inorganic nanolayer 45 may be less than or equal to about 3.0 eV. In some example embodiments, the work function of the first electrode 10 may be greater than or equal to about 4.5 eV and the work function of the inorganic nanolayer 45 may be less than or equal to about 2.8 eV. In some example embodiments, the work function of the first electrode 10 may be about 4.5 eV to about 5.0 eV and the work function of the inorganic nanolayer 45 may be about 1.5 eV to about 4.0 eV, about 1.5 eV to about 3.5 eV, about 1.5 eV to about 3.0 eV, or about 1.5 eV to about 2.8 eV.

The inorganic nanolayer 45 may include, in some example embodiments, a lanthanide element, calcium (Ca), potassium (K), aluminum (Al), or an alloy thereof. The lanthanide element may include, for example ytterbium (Yb).

As described above, the inorganic nanolayer 45 may be in contact with the surface of the first electrode 10 between the first electrode 10 and the photoelectric conversion layer 30, and it may have a thin thickness compared with the first electrode 10. Thus, the inorganic nanolayer 45 may function as a surface-treatment layer of the first electrode 10 on the surface of the first electrode 10.

In some example embodiments, the effective work function on ("at") the surface of the first electrode 10 may be different from the work function of the conductor (e.g., the transparent conductor or the reflective conductor) of the first electrode 10 by the influences of the inorganic nanolayer 45. In some example embodiments, the effective work function on the surface of the first electrode 10 may be less than the work function of the conductor (e.g., the transparent conductor or the reflective conductor) of the first electrode 10. In some example embodiments, the effective work function on the surface of the first electrode 10 may be the same as the work function of the inorganic nanolayer 45 or may have a medium value between the work function of the inorganic nanolayer 45 and the work function of the first electrode 10.

In some example embodiments, the work functions of the conductor (e.g., transparent conductor or reflective conductor) for the first electrode 10 may be greater than or equal to about 4.5 eV, and the effective work function on ("at") the surface of the first electrode 10 may be less than or equal to about 4.0 eV. In some example embodiments, the work function of the conductor (e.g., transparent conductor or reflective conductor) for the first electrode 10 may be greater than or equal to about 4.5 eV, and the effective work function on ("at") the surface of the first electrode 10 may be less than or equal to about 3.5 eV. In some example embodiments, the work function of the conductor (e.g., transparent conductor or reflective conductor) for the first electrode 10 may be greater than or equal to about 4.5 eV, and the effective work function on the surface of the first electrode 10 may be less than or equal to about 3.0 eV. In some example embodiments, the work function of the conductor (e.g., transparent conductor or reflective conductor) for the first electrode 10 may be greater than or equal to about 4.5 eV, and the effective work function on the surface of the first electrode 10 may be less than or equal to about 2.8 eV. In some example embodiments, the work function of the conductor (e.g., transparent conductor or reflective conductor) for the first electrode 10 may be about 4.5 eV to about 5.0 eV, and the effective work function on ("at") the surface of the first electrode 10 may be about 1.5 eV to about 4.0 eV, about 1.5 eV to about 3.5 eV, about 1.5 eV to about 3.0 eV, or about 1.5 eV to about 2.8 eV.

By lowering the work function on ("at") the surface of the first electrode 10 as described above, extraction of charges (e.g., electrons) passing the organic auxiliary layer 40 from the photoelectric conversion layer 30 and moving to the first electrode 10 may be further facilitated, and remaining charges may be further reduced to show a higher charge extraction efficiency.

Hereinafter, a photoelectric conversion device according to some example embodiments is described.

Figure 4:
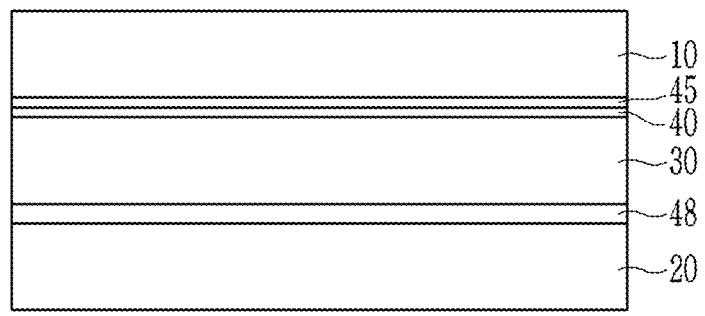
FIG. 4 is a cross-sectional view showing an example of a photoelectric conversion device according to some example embodiments.

FIG. 4 is a cross-sectional view showing an example of a photoelectric conversion device according to some example embodiments.

Referring to FIG. 4, a photoelectric conversion device 400 according to some example embodiments includes a first electrode 10, a second electrode 20, a photoelectric conversion layer 30, an organic auxiliary layer 40, and an inorganic nanolayer 45.

However, the photoelectric conversion device 400 according to some example embodiments further includes a charge blocking layer 48 between the second electrode 20 and the photoelectric conversion layer 30. The charge blocking layer 48 may enhance photoelectric conversion efficiency by blocking charges (e.g., holes) separated from the photoelectric conversion layer 30 from moving to the opposed electrode and details thereof are the same as described above.

The photoelectric conversion devices 100, 200, 300, and 400 may be applied to various electronic devices, for example a solar cell, an organic sensor, a photodetector, and a photosensor, but is not limited thereto.

The photoelectric conversion devices 100, 200, 300, and 400 may be for example applied to an organic sensor.

Hereinafter, examples of organic sensors using the photoelectric conversion devices 100, 200, 300, and 400 will be described with reference to the drawings.

Figure 5:
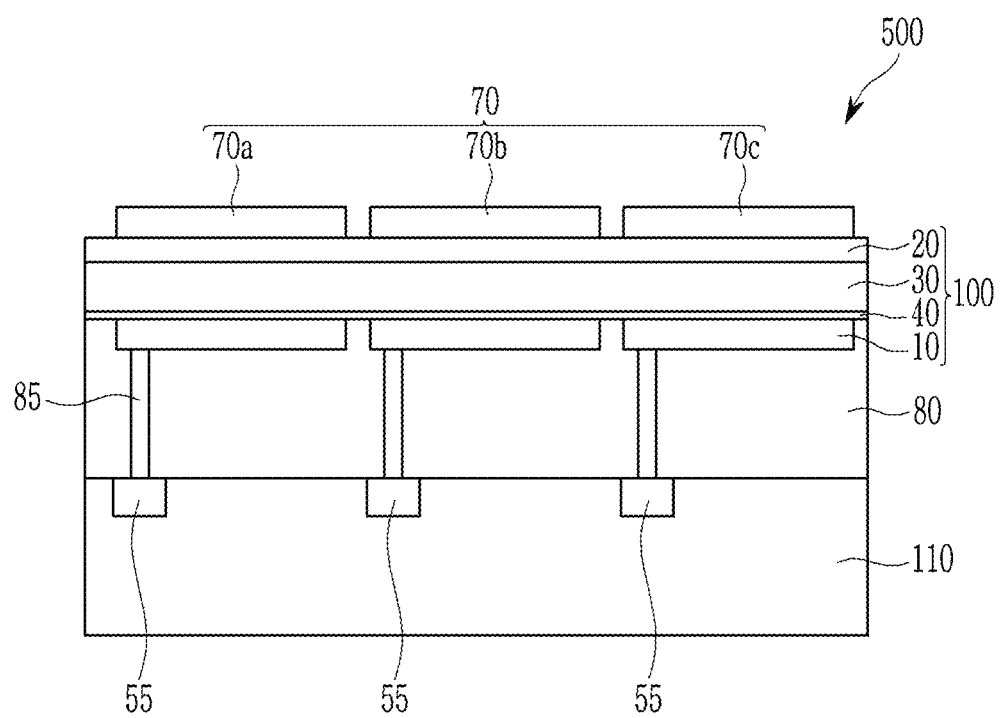
FIG. 5 is a schematic cross-sectional view showing an example of an organic sensor according to some example embodiments.

FIG. 5 is a schematic cross-sectional view showing an example of an organic sensor according to some example embodiments.

In some example embodiments, the organic sensor may be an organic CMOS organic sensor.

Referring to FIG. 5, an organic sensor 500 according to some example embodiments includes a semiconductor substrate 110, an insulation layer 80, a photoelectric conversion device 100, and a color filter layer 70.

The semiconductor substrate 110 may be a silicon substrate, and is integrated with the transmission transistor (not shown) and the charge storage 55. The transmission transistor and/or the charge storage 55 may be integrated in each pixel.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), and alloys thereof, but are not limited thereto.

The insulation layer 80 is formed on the metal wire and the pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 55. The trench 85 may be filled with fillers.

The photoelectric conversion device 100 is formed on the insulation layer 80. The photoelectric conversion device 100 includes a first electrode 10, an organic auxiliary layer 40, a photoelectric conversion layer 30, and a second electrode 20 as described above. Details thereof are the same as described above.

A color filter layer 70 is formed on the photoelectric conversion device 100. The color filter layer 70 includes a blue filter 70a formed in a blue pixel, a red filter 70b formed in a red pixel, and a green filter 70c formed in a green pixel. However, the color filter layer 70 may include a cyan filter, a magenta filter, and/or a yellow filter instead of the above color filters or may further include them in addition to the above color filters. It will be understood that a color filter is configured to selectively transmit a particular wavelength spectrum of light. Where a color filter overlaps a photo-sensing device, the color filter may be configured to selectively transmit a particular wavelength spectrum of light to a photo-sensing device so that the photo-sensing device is configured to absorb, and convert into electrical signals, the particular wavelength spectrum of light.

Focusing lens (not shown) may be further formed on the color filter layer 70. The focusing lens may control a direction of incident light and gather the light in one region. The focusing lens may have a shape of, in some example embodiments, a cylinder or a hemisphere, but is not limited thereto.

Even though the structure including the stacked photoelectric conversion device 100 of FIG. 1 is for example illustrated in FIG. 5, structures in which the photoelectric conversion devices 200, 300, and 400 of FIGS. 2, 3, and 4 are stacked may be applied in the same manner.

Figure 6:
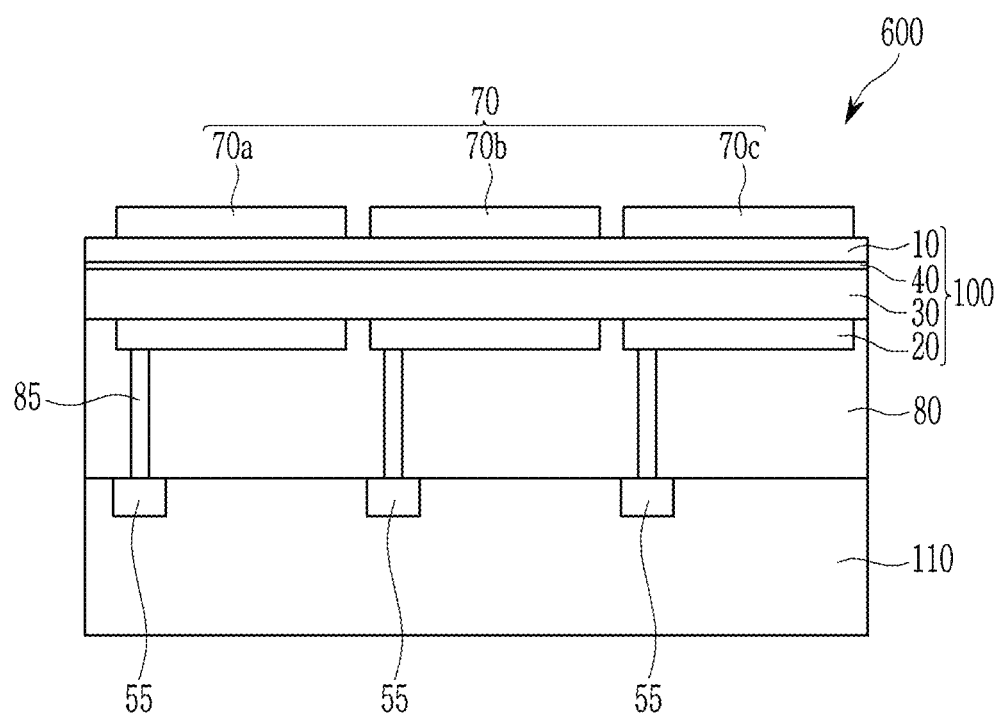
FIG. 6 is a schematic cross-sectional view showing an example of an organic sensor according to some example embodiments.

FIG. 6 is a schematic cross-sectional view showing an example of an organic sensor according to some example embodiments.

Referring to FIG. 6, an organic sensor 600 according to some example embodiments includes a semiconductor substrate 110 integrated with a transmission transistor (not shown) and a charge storage 55, an insulation layer 80, a photoelectric conversion device 100, and a color filter layer 70.

However, in the organic sensor 600 according to some example embodiments, the positions of the first electrode 10 and the second electrode 20 of the photoelectric conversion device 100 are changed. That is, the first electrode 10 may be a light-receiving electrode.

Even though the structure including the stacked photoelectric conversion device 100 of FIG. 1 is for example illustrated in FIG. 6, structures in which the photoelectric conversion devices 200, 300, and 400 of FIGS. 2, 3, and 4 are stacked may be applied in the same manner.

Figure 7:
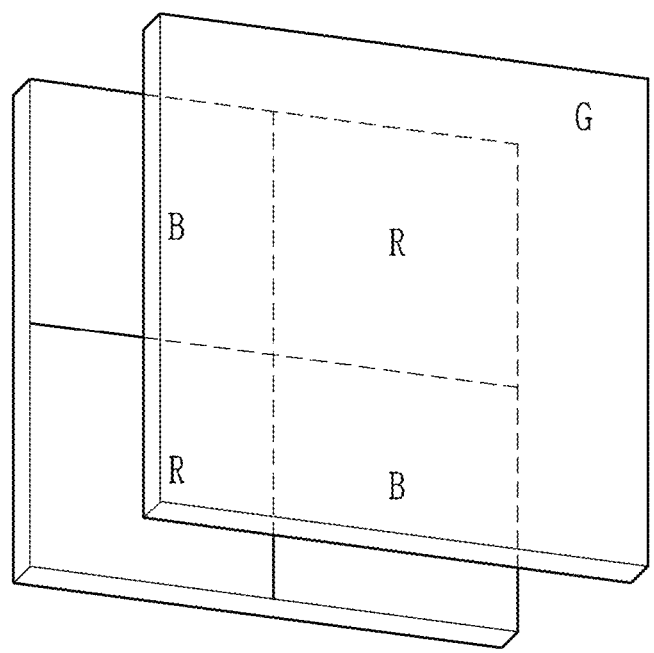
FIG. 7 is a schematic top plan view showing an example of an organic sensor according to some example embodiments.
Figure 8:
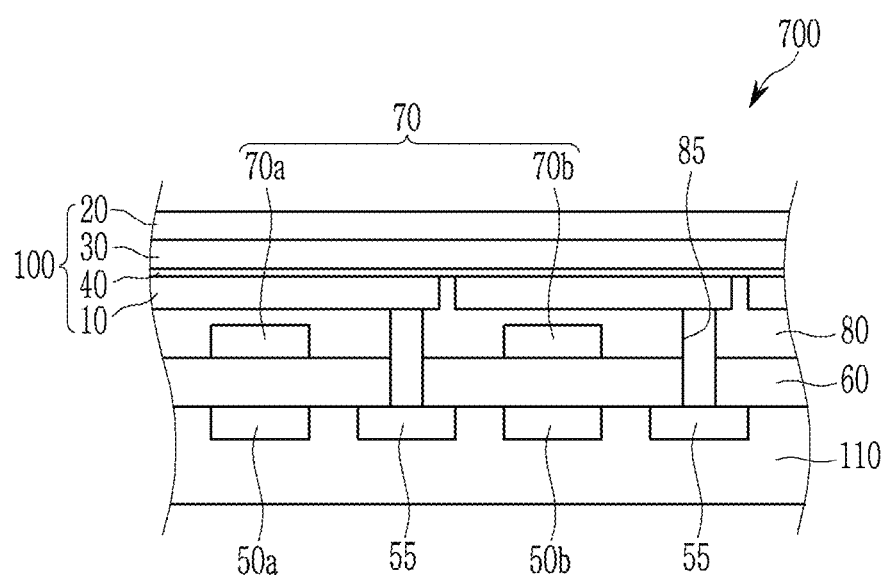
FIG. 8 is a schematic cross-sectional view showing an example of the organic sensor of FIG. 7.
Figure 9:
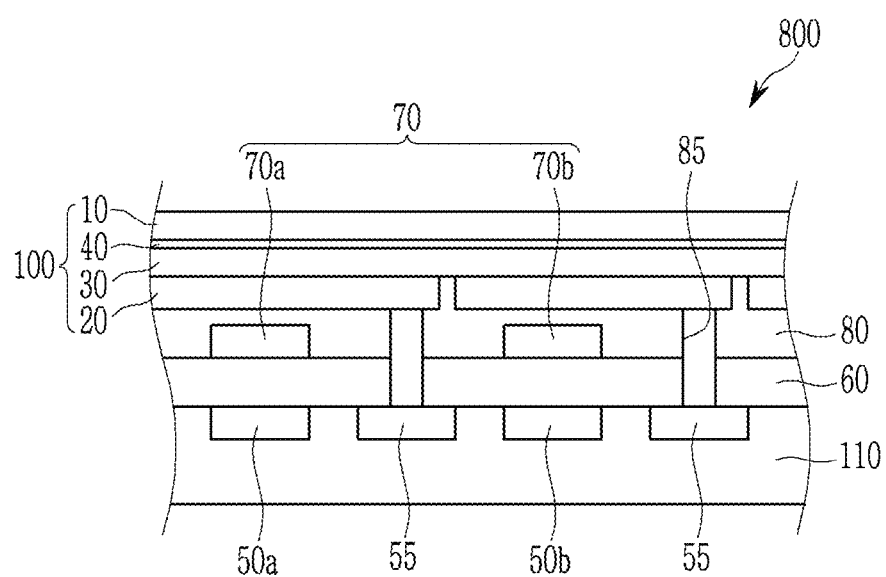
FIG. 9 is a schematic cross-sectional view showing an example of the organic sensor of FIG. 7.

FIG. 7 is a schematic top plan view showing an example of an organic sensor according to some example embodiments and FIGS. 8 and 9 are schematic cross-sectional view showing examples of the organic sensor of FIG. 7, respectively.

Referring to FIGS. 7 and 8, an organic sensor 700 according to some example embodiments includes a semiconductor substrate 110 integrated with photo-sensing devices 50a and 50b, a transmission transistor (not shown), and a charge storage 55, a lower insulation layer 60, a color filter layer 70, an upper insulation layer 80, and a photoelectric conversion device 100.

The semiconductor substrate 110 may be a silicon substrate, and is integrated with the photo-sensing devices 50a and 50b, the transmission transistor (not shown), and the charge storage 55. The photo-sensing devices 50a and 50b may be photodiodes.

The photo-sensing devices 50a and 50b, the transmission transistor, and/or the charge storage 55 may be integrated in each pixel, and as shown in the drawing, the photo-sensing devices 50a and 50b may be respectively included in a blue pixel and a red pixel and the charge storage 55 may be included in a green pixel.

The photo-sensing devices 50a and 50b sense light, the information sensed by the photo-sensing devices may be transferred by the transmission transistor, the charge storage 55 is electrically connected to the photoelectric conversion device 100 that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, in some example embodiments, aluminum (Al), copper (Cu), silver (Ag), and alloys thereof, but are not limited thereto. Further, it is not limited to the structure, and the metal wire and pad may be disposed under the photo-sensing devices 50a and 50b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench 85 exposing the charge storage 55. The trench 85 may be filled with fillers.

A color filter layer 70 is formed on the lower insulation layer 60. The color filter layer 70 includes a blue filter 70a formed in a blue pixel and a red filter 70b in a red pixel. In some example embodiments, a green filter is not included, but a green filter may be further included. For another example, the color filter layer 70 may be disposed on the photoelectric conversion device 100.

The upper insulation layer 80 is formed on the color filter layer 70. The upper insulation layer 80 may eliminate a step caused by the color filter layer 70 and smoothen the surface. The upper insulation layer 80 and the lower insulation layer 60 may include a contact hole (not shown) exposing a pad, and a trench 85 trench 85.

The photoelectric conversion device 100 is formed on the upper insulation layer 80. The photoelectric conversion device 100 includes the first electrode 10, the organic auxiliary layer 40, the photoelectric conversion layer 30, and the second electrode 20 as described above. Details are the same as described above.

Focusing lens (not shown) may be further formed on the photoelectric conversion device 100. The focusing lens may control a direction of incident light and gather the light in one region. The focusing lens may have a shape of, in some example embodiments, a cylinder or a hemisphere, but is not limited thereto.

Referring to FIG. 9, the organic sensor 800 according to some example embodiments includes a semiconductor substrate 110 integrated with photo-sensing devices 50a and 50b, a transmission transistor (not shown), and a charge storage 55, a lower insulation layer 60, a color filter layer 70, an upper insulation layer 80, and a photoelectric conversion device 100.

However, in the organic sensor 800 according to some example embodiments, the positions of the first electrode 10 and the second electrode 20 are changed. That is, the first electrode 10 may be a light-receiving electrode.

Even though the structure including the stacked photoelectric conversion device 100 of FIG. 1 is for example illustrated in FIGS. 8 and 9, structures in which the photoelectric conversion devices 200, 300, and 400 of FIGS. 2, 3, and 4 are stacked may be applied in the same manner.

Figure 10:
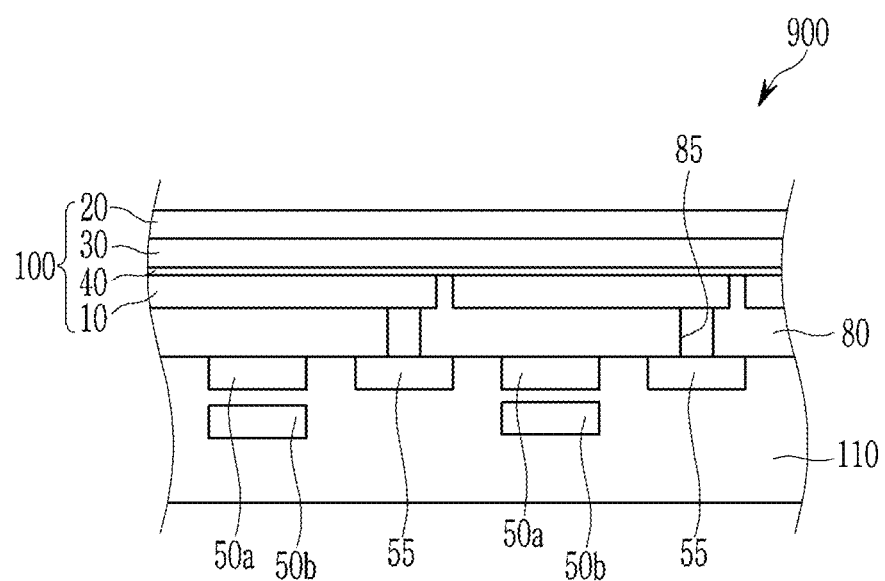
FIG. 10 is a schematic cross-sectional view showing an example of an organic sensor according to some example embodiments.

FIG. 10 is a schematic cross-sectional view showing an example of an organic sensor according to some example embodiments.

An organic sensor 900 according to some example embodiments includes a semiconductor substrate 110 integrated with photo-sensing devices 50a and 50b, a transmission transistor (not shown), and a charge storage 55, an insulation layer 80 having a trench 85, and a photoelectric conversion device 100.

However, in the organic sensor 900 according to some example embodiments, the photo-sensing devices 50a and 50b are stacked in a vertical direction and the color filter layer 70 is omitted. The photo-sensing devices 50a and 50b are electrically connected to charge storage (not shown) and may be transferred by the transmission transistor. The photo-sensing devices 50a and 50b may selectively absorb light in each wavelength spectrum of light depending on a stacking depth.

Even though the structure including the stacked photoelectric conversion device 100 of FIG. 1 is for example illustrated in FIG. 10, structures in which the photoelectric conversion devices 200, 300, and 400 of FIGS. 2, 3, and 4 are stacked may be applied in the same manner.

Figure 11:
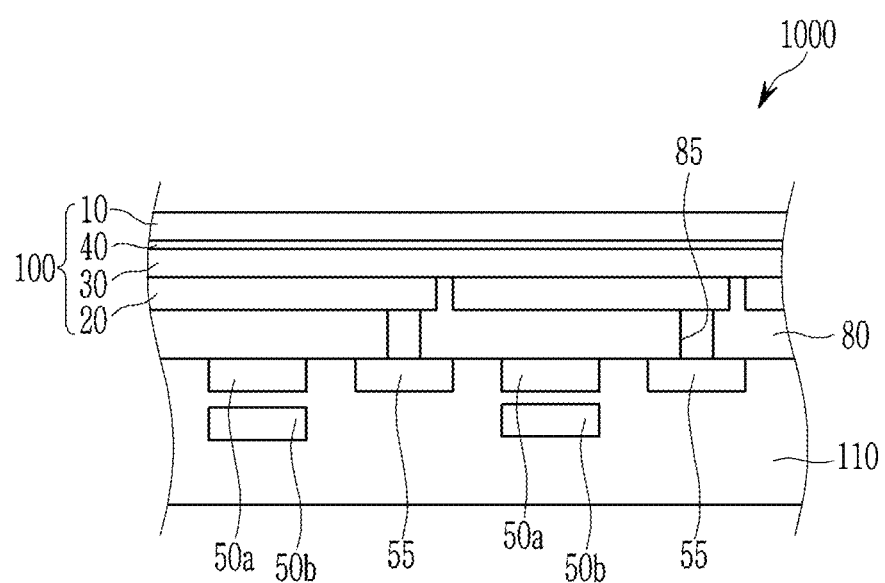
FIG. 11 is a schematic cross-sectional view showing an example of an organic sensor according to some example embodiments.

FIG. 11 is a schematic cross-sectional view showing an example of an organic sensor according to some example embodiments.

Referring to FIG. 11, an organic sensor 1000 according some example embodiments includes a semiconductor substrate 110 integrated with photo-sensing devices 50a and 50b, a transmission transistor (not shown), and a charge storage 55, an insulation layer 80 having a trench 85, and a photoelectric conversion device 100. However, in the organic sensor 1000 according to some example embodiments, the positions of the first electrode 10 and the second electrode 20 are changed. That is, the first electrode 10 may be a light-receiving electrode.

Even though the structure including the stacked photoelectric conversion device 100 of FIG. 1 is for example illustrated in FIG. 11, structures in which the photoelectric conversion devices 200, 300, and 400 of FIGS. 2, 3, and 4 are stacked may be applied in the same manner.

Figure 12:
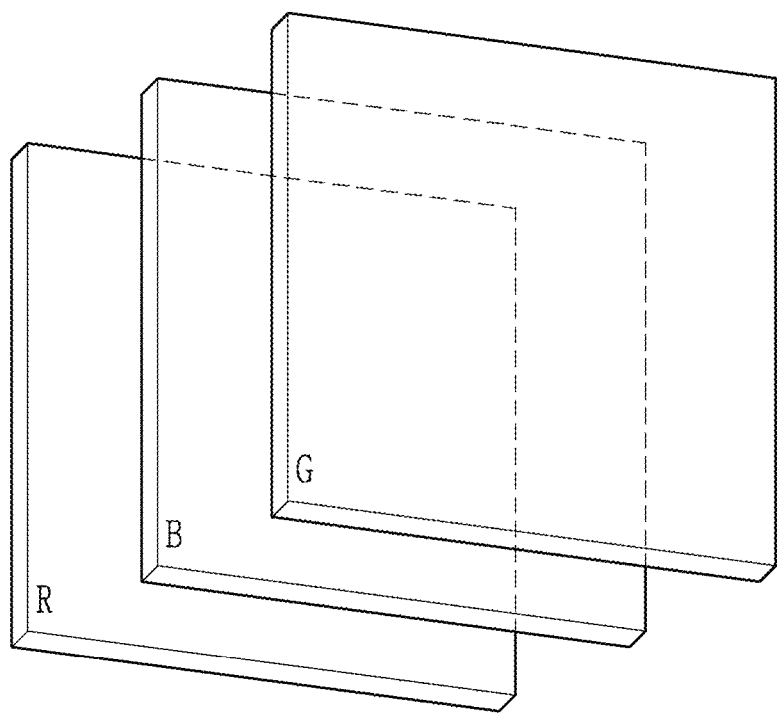
FIG. 12 is a schematic top plan view showing an example of an organic sensor according to some example embodiments.
Figure 13:
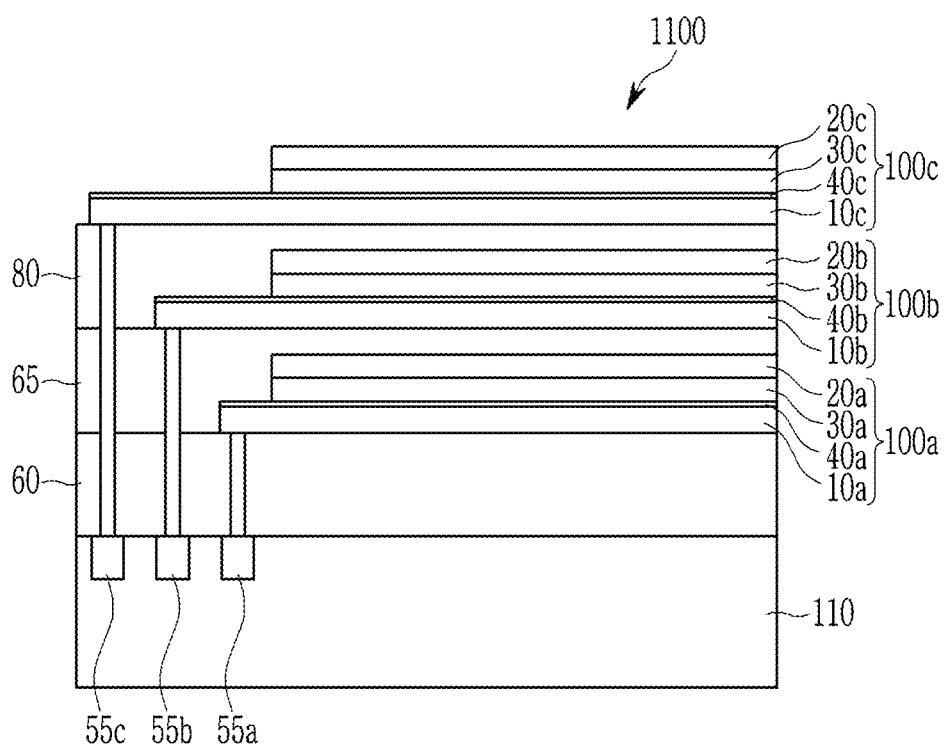
FIG. 13 is a schematic cross-sectional view showing an example of the organic sensor of FIG. 12.

FIG. 12 is a schematic top plan view showing an example of an organic sensor according to some example embodiments, and FIG. 13 is a schematic cross-sectional view showing an example of the organic sensor of FIG. 12.

An organic sensor 1100 according to some example embodiments has a structure in which a green photoelectric conversion device selectively absorbing light in a green wavelength spectrum of light, a blue photoelectric conversion device selectively absorbing light in a blue wavelength spectrum of light, and a red photoelectric conversion device selectively absorbing light in a red wavelength spectrum of light are stacked.

The organic sensor 1100 according to some example embodiments includes a semiconductor substrate 110, a lower insulation layer 60, an intermediate insulation layer 65, an upper insulation layer 80, a first photoelectric conversion device 100a, a second photoelectric conversion device 100b, and a third photoelectric conversion device 100c.

The semiconductor substrate 110 may be a silicon substrate, and is integrated with the transmission transistor (not shown) and the charge storage 55a, 55b, and 55c. A metal wire (not shown) and a pad (not shown) are formed on the semiconductor substrate 110, and the lower insulation layer 60 is formed on the metal wire and the pad.

The first photoelectric conversion device 100a is formed on the lower insulation layer 60.

The first photoelectric conversion device 100a includes a first electrode 10a and a second electrode 20a facing each other, and a photoelectric conversion layer 30a and an organic auxiliary layer 40a disposed between the first electrode 10a and the second electrode 20a. The first electrode 10a, the second electrode 20a, the photoelectric conversion layer 30, and the organic auxiliary layer 40a are the same as described above, and the photoelectric conversion layer 30a may selectively absorb light in one of red, blue, and green wavelength spectra of light. In some example embodiments, the first photoelectric conversion device 100a may be a red photoelectric conversion device.

The intermediate insulation layer 65 may be formed on the first photoelectric conversion device 100a.

The second photoelectric conversion device 100b may be formed on the intermediate insulation layer 65.

The second photoelectric conversion device 100b includes a first electrode 10b and a second electrode 20b, and a photoelectric conversion layer 30b and an organic auxiliary layer 40b between the first electrode 10b and the second electrode 20b. The first electrode 10b, the second electrode 20b, the photoelectric conversion layer 30b, and the organic auxiliary layer 40b are the same as described above, and the photoelectric conversion layer 30b may selectively absorb light in one of red, blue, and green wavelength spectra of light. In some example embodiments, the first photoelectric conversion device 100b may be a blue photoelectric conversion device.

The upper insulation layer 80 may be formed on the second photoelectric conversion device 100b. The lower insulation layer 60, the intermediate insulation layer 65, and the upper insulation layer 80 have a plurality of trenches 85 exposing the charge storages 55a, 55b, and 55c.

The third photoelectric conversion device 100c is formed on the upper insulation layer 80. The third photoelectric conversion device 100c includes a first electrode 10c and a second electrode 20c facing each other, and a photoelectric conversion layer 30c and an organic auxiliary layer 40c disposed between the first electrode 10c and the second electrode 20c. The first electrode 10c, the second electrode 20c, the photoelectric conversion layer 30c, and the organic auxiliary layer 40c are the same as described above, and the photoelectric conversion layer 30c may selectively absorb light in one of red, blue, and green wavelength spectra of light. In some example embodiments, the third photoelectric conversion device 100c may be a green photoelectric conversion device and may be the photoelectric conversion device 100.

Focusing lens (not shown) may be further formed on the photoelectric conversion device 100c. The focusing lens may control a direction of incident light and gather the light in one region. The focusing lens may have a shape of, in some example embodiments, a cylinder or a hemisphere, but is not limited thereto.

In the drawing, even though as the first photoelectric conversion device 100a, the second photoelectric conversion device 100b, and the third photoelectric conversion device 100c, the photoelectric conversion device 100 of FIG. 1 is for example illustrated, photoelectric conversion devices 200, 300, and 400 of FIG. 2, 3, or 4 may be applied in the same manner.

In the drawing, the first photoelectric conversion device 100a, the second photoelectric conversion device 100b, and the third photoelectric conversion device 100c are sequentially stacked, but the present disclosure is not limited thereto, and they may be stacked in various orders.

As described above, the first photoelectric conversion device 100a, the second photoelectric conversion device 100b, and the third photoelectric conversion device 100c are stacked, and thus the size of an organic sensor may be reduced to realize a down-sized organic sensor.

Figure 14:
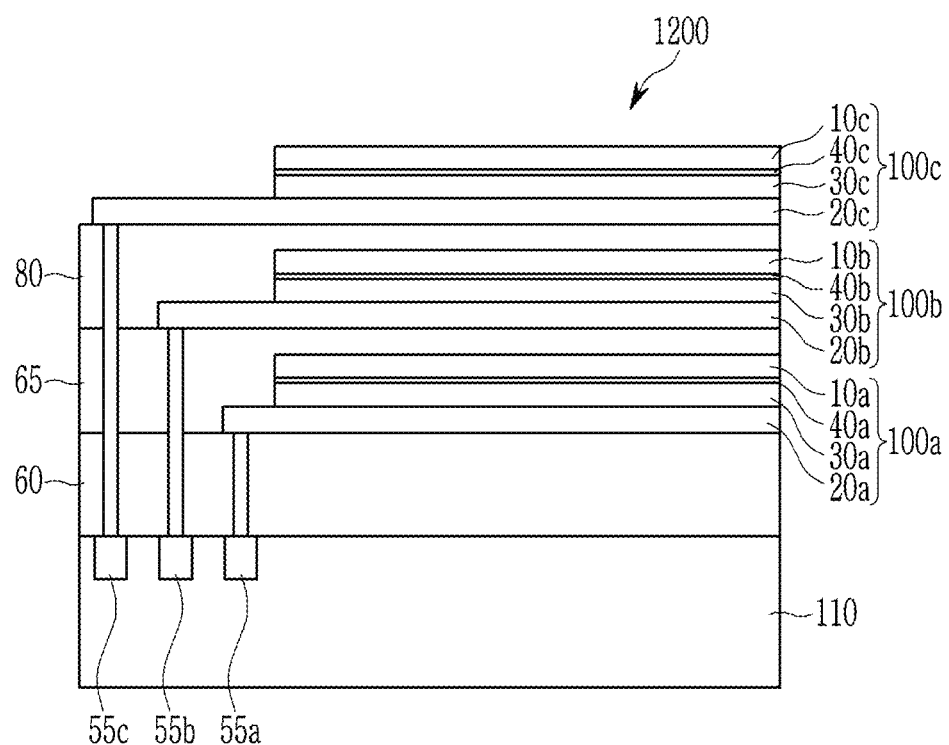
FIG. 14 is a schematic cross-sectional view showing an example of the organic sensor of FIG. 12.

FIG. 14 is a schematic cross-sectional view showing an example of an organic sensor according to some example embodiments.

Referring to FIG. 14, an organic sensor 1200 according some example embodiments includes a semiconductor substrate 110, a lower insulation layer 60, an intermediate insulation layer 65, an upper insulation layer 80, a first photoelectric conversion device 100a, a second photoelectric conversion device 100b, and a third photoelectric conversion device 100c. However, the positions of the first electrode 10 and the second electrode 20 of the first photoelectric conversion device 100a, the second photoelectric conversion device 100b, and the third photoelectric conversion device 100c are changed. That is, the first electrode 10 may be a light-receiving electrode.

The photoelectric conversion device and the organic sensor may be applied to various electronic devices, for example a mobile phone or a digital camera, but are not limited thereto.

Figure 15:
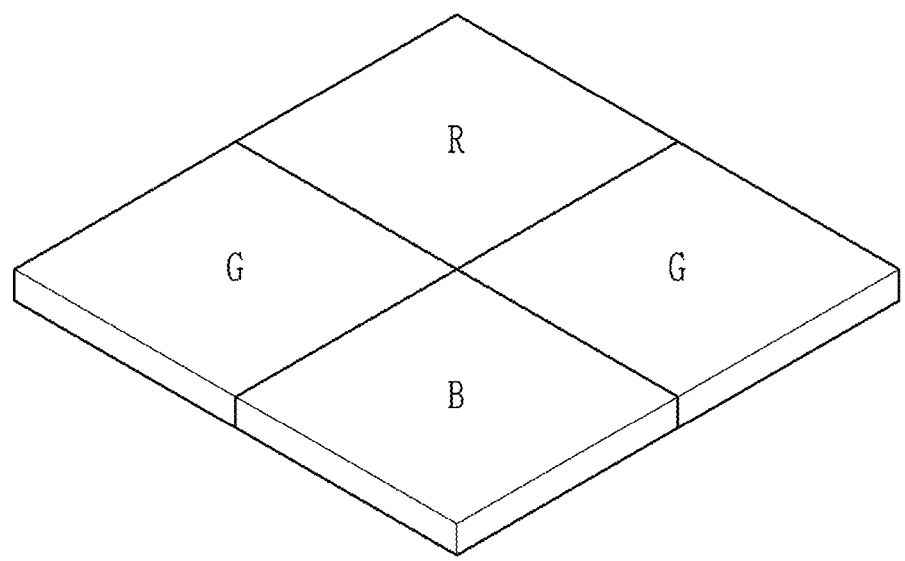
FIG. 15 is a schematic top plan view showing an example of an organic sensor according to some example embodiments.
Figure 16:
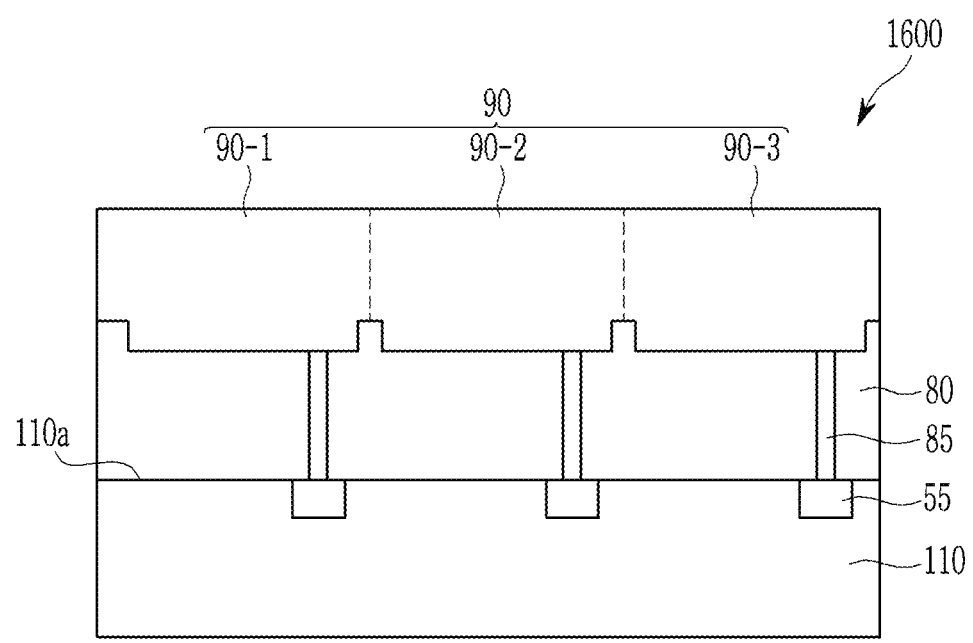
FIG. 16 is a schematic cross-sectional view showing an example of the organic sensor of FIG. 16.

FIG. 15 is a schematic top plan view showing an example of an organic sensor according to some example embodiments, and FIG. 16 is a schematic cross-sectional view showing an example of the organic sensor of FIG. 16.

As shown with reference to FIGS. 15-16, an organic sensor 1600 may include a photoelectric conversion device 90 that itself includes a plurality of photoelectric conversion devices 90-1, 90-2, and 90-3 on a semiconductor substrate 110, where the plurality of photoelectric conversion devices 90-1, 90-2, and 90-3 are configured to convert different wavelength spectra of light (e.g., different ones of blue light, green light, or red light) into electric signals, respectively. As shown in FIG. 16, the separate photoelectric conversion devices 90-1 to 90-3 may be horizontally arranged on the semiconductor substrate 110 such that the photoelectric conversion devices 90-1 to 90-3 are partially or entirely overlapped with each other in a direction that extends in parallel with a top surface 110a of the semiconductor substrate 110. As shown each separate photoelectric conversion device 90-1 to 90-3 is connected to a separate charge storage 55 that is integrated into the semiconductor substrate 110 via a separate trench 85.

Each photoelectric conversion device 90-1 to 90-3 of the photoelectric conversion device 90 may be any one of the photoelectric conversion devices 100-400 described herein. In some example embodiments, separate photoelectric conversion devices 90-1 to 90-3 may include different portions of a common, continuous layer that extends continuously between two or more of the photoelectric conversion devices 90-1 to 90-3. In some example embodiments, the photoelectric conversion devices 90-1 to 90-3 may share a common first electrode 10 and a common second electrode 20. In another example, two or more of the photoelectric conversion devices 90-1 to 90-3 may have different photoelectric conversion layers 30 that are configured to absorb different wavelength spectra of incident light. In another example, two or more of the photoelectric conversion devices 90-1 to 90-3 may have different configurations of organic auxiliary layers 40, different inorganic nanolayers 45, different charge blocking layers 48, some combination thereof, or the like, such that, for example one or more of the photoelectric conversion devices 90-1 to 90-3 may include a charge blocking layer 48 and another one or more of the photoelectric conversion devices 90-1 to 90-3 may omit a charge blocking layer 48. Other structures of organic sensor 1600 may be the same as one or more of the organic sensors described with reference to any of FIGS. 5-14.

Figure 17:
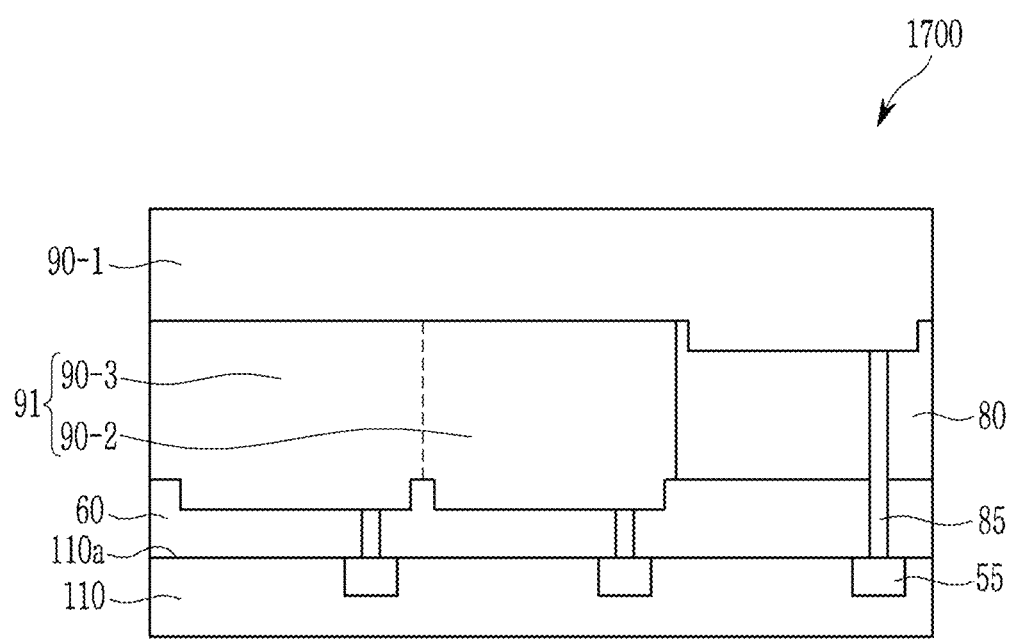
FIG. 17 is a schematic cross-sectional view of an organic sensor according to some example embodiments.

FIG. 17 is a schematic cross-sectional view of an organic sensor according to some example embodiments.

Referring to FIG. 17, an organic sensor 1700 may include a semiconductor substrate 110 and photoelectric conversion devices 90-1 and 91 that are stacked on each other so as to at least partially overlap in a direction extending perpendicular to the top surface 110a of the semiconductor substrate 110, and wherein at least one of the photoelectric conversion devices 90-1 and 91 further includes multiple photoelectric conversion devices 90-2 and 90-3 that are arranged so as to overlap in a direction extending parallel to the top surface 110a of the semiconductor substrate 110, and where the plurality of photoelectric conversion devices 90-1, 90-2, and 90-3 are configured to convert different wavelength spectra of light (e.g., different ones of blue light, green light, or red light) into electric signals, respectively. It will be understood that, in some example embodiments, photoelectric conversion device 90-1 includes multiple, horizontally-arranged photoelectric conversion devices configured to absorb different wavelengths spectra of light while photoelectric conversion device 91 is limited to a single photoelectric conversion device that is configured to absorb a single wavelength spectrum of light. In some example embodiments, including the example embodiments shown in FIG. 17, an entirety of the photoelectric conversion device 91 overlaps a limited portion of the photoelectric conversion device 90-1 in the direction extending perpendicular to the top surface 110a and a remainder portion of the photoelectric conversion device 90-1 that is exposed by the photoelectric conversion device 91 is covered by insulation layer 80. However, it will be understood that in some example embodiments an entirety of the photoelectric conversion device 90-1 overlaps a limited portion of the photoelectric conversion device 91 in the direction extending perpendicular to the top surface 110a. Other structures of organic sensor 1700 may be are the same as one or more of the organic sensors described with reference to any of FIGS. 5-14.

Figure 18:
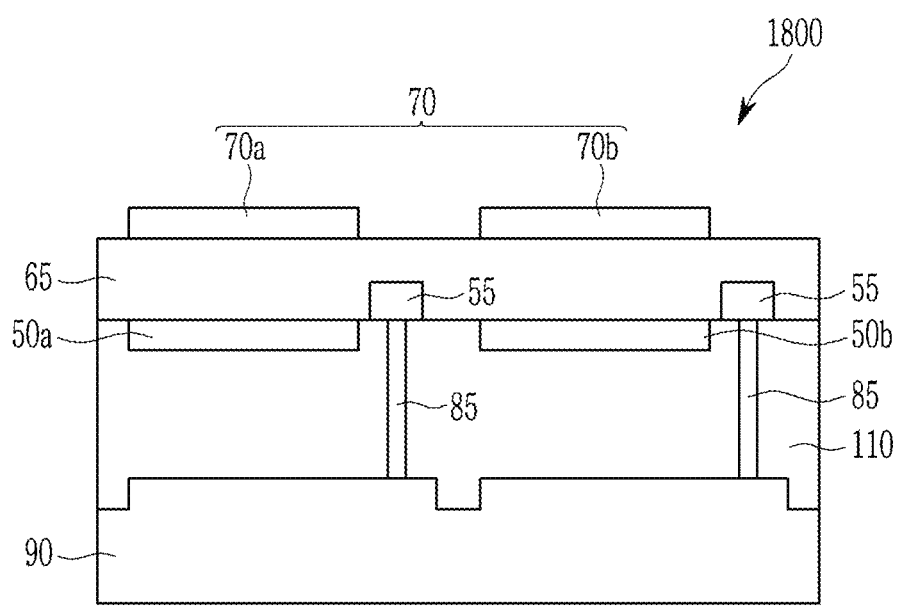
FIG. 18 is a schematic cross-sectional view of an organic sensor according to some example embodiments.

FIG. 18 is a schematic cross-sectional view of an organic sensor according to some example embodiments.

Referring to FIG. 18, an organic sensor 1800 according to some example embodiments includes a semiconductor substrate 110 integrated with photo-sensing devices 50a and 50b, a transmission transistor (not shown) and a charge storage 55, an intermediate insulation layer 65, and a color filter layer 70 on the semiconductor substrate 110, and a photoelectric conversion device 90 under the semiconductor substrate 110. The photoelectric conversion device 90 shown in FIG. 18 may be any of the example embodiments of photoelectric conversion devices described herein. As shown in FIG. 18, the photoelectric conversion device 90 may be on (e.g., above or beneath) the semiconductor substrate 110, such that the color filter layer 70 is distal from the photoelectric conversion device 90 in relation to the photo-sensing devices 50a and 50b. Other structures of organic sensor 1800 may be are the same as one or more of the organic sensors described with reference to any of FIGS. 5-14.

It will be understood that, where an organic sensor includes a photo-sensing device and a photoelectric conversion device, the photo-sensing device and the photoelectric conversion device may be configured to absorb different, first and second wavelength spectra of light and convert said absorbed light into electric signals.

While FIG. 18 illustrates example embodiments where color filters 70a, 70b of a color filter layer overlap separate, respective photo-sensing devices 50a, 50b, it will be understood that in some example embodiments an organic sensor may include one or more photo-sensing devices and may omit one or more color filters 70a, 70b overlapping the one or more photo-sensing devices in the direction extending perpendicular to the top surface 110a. Such one or more photo-sensing devices may be configured to sense light having a particular, limited wavelength spectrum of light in the absence of the light being filtered by a color filter prior to being received at the photo-sensing device. Accordingly, it will be understood that, in some example embodiments, the organic sensors 500, 600, 700, 800, 900, 1000, and 1800 may omit the color filters illustrated in said organic sensors.

Figure 19:
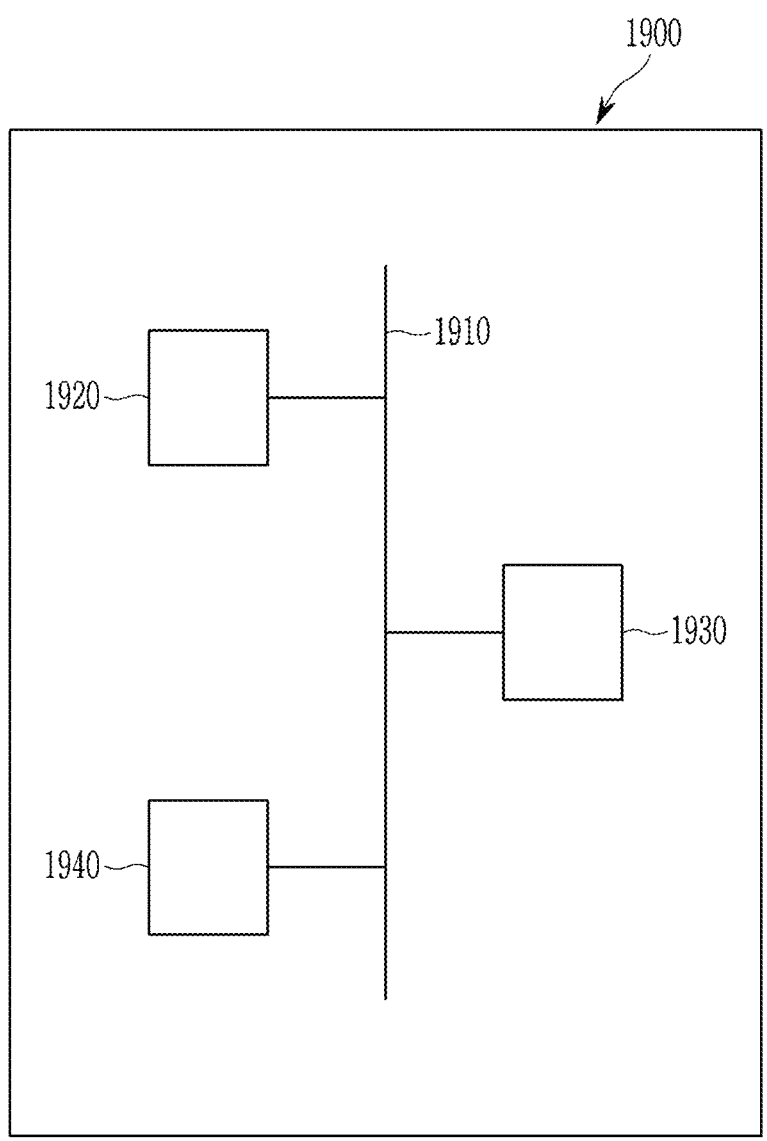
FIG. 19 is a schematic diagram of an electronic device according to some example embodiments.

FIG. 19 is a schematic diagram of an electronic device 1900 according to some example embodiments.

As shown in FIG. 19, an electronic device 1900 may include a processor 1920, a memory 1930, and an organic sensor 1940 that are electrically coupled together via a bus 1910. The organic sensor 1940 may be an organic sensor of any of the example embodiments as described herein, and the organic sensor included in the organic sensor 1940 may include any of the photoelectric conversion devices described herein according to any of the example embodiments of the inventive concepts. The memory 1930, which may be a non-transitory computer readable medium, may store a program of instructions. The processor 1920 may execute the stored program of instructions to perform one or more functions. In some example embodiments, the processor 1920 may be configured to process electric signals generated by the organic sensor 1940. The processor 1920 may be configured to generate an output (e.g., an image to be displayed on a display interface) based on processing the electric signals.

Hereinafter, some example embodiments are illustrated in more detail with reference to examples. However, the present disclosure is not limited to the following examples.

Example 1

A 150 nm-thick anode is formed by sputtering ITO on a glass substrate.

Subsequently, a compound represented by Chemical Formula A is deposited on the anode to provide a 5 nm-thick charge blocking layer. Subsequently, a p-type semiconductor ($\lambda_{max}$: 545 nm, charge mobility: $1.5 \times 10^{-5}$ cm$^2$/Vs) represented by Chemical Formula B-1 and a n-type semiconductor that is fullerene (C60) are co-deposited on the charge blocking film in a volume ratio of 1:1 to provide a 90 nm-thick photoelectric conversion layer. Subsequently, an organic semiconductor (charge mobility: $1.8 \times 10^{-2}$ cm$^2$/Vs) represented by Chemical Formula C-1 is thermally evaporated on the photoelectric conversion layer to provide a 5 nm-thick organic auxiliary layer. Subsequently, ITO (WF: 4.7 eV) is sputtered on the organic auxiliary layer to provide a 7 nm-thick cathode. Subsequently, aluminum oxide ($Al_2O_3$) is deposited on the cathode to provide a 50 nm-thick anti-reflection layer and sealed with a glass plate to provide a photoelectric conversion device.

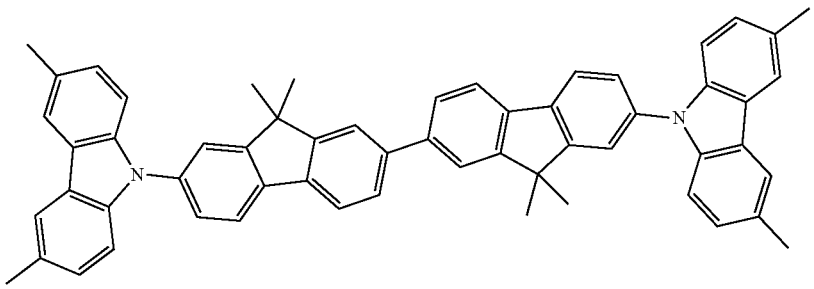

[Chemical Formula A]

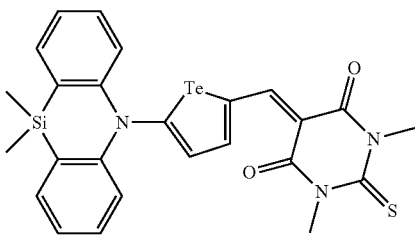

[Chemical Formula B-1]

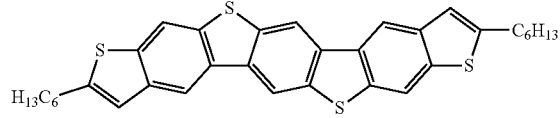

[Chemical Formula C-1]

Each charge mobility of the p-type semiconductor represented by Chemical Formula B-1 and the organic semiconductor represented by Chemical Formula C-1 is measured by a time-of-flight. The time-of-flight is a method in which the charge mobility is specifically measured by forming a 1 μm-thick semiconductor layer including the p-type semiconductor represented by Chemical Formula B-1 or the organic semiconductor represented by Chemical Formula C-1 between the ITO electrode and the Al electrode (80 nm), and evaluating a light current.

Example 2

A photoelectric conversion device is manufactured in accordance with the same procedure as in Example 1, except that Yb (WF: 2.6 eV) is thermally evaporated on the organic auxiliary layer to additionally provide a 1.5 μm-thick inorganic nanolayer.

Comparative Example 1

A photoelectric conversion device is manufactured in accordance with the procedure as in Example 1, except that the organic auxiliary layer is not formed.

Reference Example 1

A photoelectric conversion device is manufactured in accordance with the same procedure as in Example 1, except that the organic auxiliary layer is not formed, and a 100 nm-thick photoelectric conversion layer is formed instead of the 90 nm-thick photoelectric conversion layer.

Evaluation I

A photoelectric conversion efficiency of each photoelectric conversion device according to Example, Comparative Example and Reference Example is evaluated according to a wavelength.

The photoelectric conversion efficiency may be evaluated from an external quantum efficiency (EQE) at a maximum absorption wavelength ($\lambda_{max}$) (about 540 nm) and evaluated in a wavelength spectrum of light of 400 nm to 720 nm by Incident Photon to Current Efficiency (IPCE) method.

The results are shown in Table 1.

TABLE 1

|  | EQE (@$\lambda_{max}$, 3 V) (%) |
| --- | --- |
| Example 1 | 68.0 |
| Example 2 | 69.4 |
| Comparative Example 1 | 66.2 |
| Reference Example 1 | 69.2 |

Referring to Table 1, it is confirmed that the photoelectric conversion devices according to Examples 1 and 2 improve the photoelectric conversion efficiency compared with the photoelectric conversion device according to Comparative Example 1.

In addition, it is confirmed that the photoelectric conversion devices according to Examples 1 and 2 show an equivalent level to photoelectric conversion efficiency to the photoelectric conversion device according to Reference Example 1 having a thick photoelectric conversion layer, thereby, it is also confirmed that the photoelectric conversion devices according to Examples 1 and 2 show a high photoelectric conversion efficiency while reducing the thickness of the photoelectric conversion layer.

Evaluation II

The photoelectric conversion efficiency of each photoelectric conversion device according to Examples 1 and 2 and Comparative Example 1 is evaluated depending upon an applied voltage.

The results are shown in Table 2.

TABLE 2

|  | Photoelectric conversion efficiency (EQE, %) | | |
| --- | --- | --- | --- |
|  | @ 0 V | @ 2 V | @ 7 V |
| Example 1 | 52.0 | 65.1 | 74.8 |
| Example 2 | 55.7 | 66.8 | 75.6 |
| Comparative Example 1 | 49.8 | 63.2 | 72.7 |

Referring to Table 2, it is confirmed that the photoelectric conversion devices according to Examples 1 and 2 improve photoelectric conversion efficiency at each applying voltage compared with the photoelectric conversion device according to Comparative Example 1.

Evaluation III

Image lag characteristics are evaluated for photoelectric conversion devices according to Examples 1 and 2 and Comparative Example 1.

The image lag may be evaluated by irradiating a light in a wavelength spectrum of light in which a photoelectric conversion may occur into the photoelectric conversion devices according to Examples and Comparative Examples for a particular (or, alternatively, predetermined) time; turning off the light; and measuring a time to take for reaching 6 pA by using a Keithley 2400 equipment. As the image lag is the higher, the electron remains the more, thus afterimages may be much frequently found.

The results are shown in Table 3.

TABLE 3

|  | Lag (msec) |
| --- | --- |
| Example 1 | 49 |
| Example 2 | 46 |
| Comparative Example 1 | 53 |

Referring to Table 3, it is confirmed that the photoelectric conversion devices according to Examples 1 and 2 show reduced image lag compared with the photoelectric conversion device according to Comparative Example 1, thereby it is estimated that the charge extract characteristic is improved.

Evaluation IV

Organic sensors employing the photoelectric conversion devices according to Examples 1 and 2 and Comparative Example 1 are designed, and the organic sensor is evaluated for YSNR10.

The YSNR10 of the organic sensor is a minimum light dose (unit: lux) in which a ratio of signal to noise (signal/noise) becomes 10, wherein the signal is a signal sensitivity obtained by performing a RGB raw signal calculated by a FDTD (finite difference time domain method) with a color correction step through a color correction matrix (CCM), and the noise is a noise generated when measuring the signal in the organic sensor. The color correction step is a step of reducing a difference from the real color by image-processing the RGB raw signal obtained from the organic sensor. As the YSNR10 has the lower value, the image characteristics are getting the better in a low light dose.

The results are shown in Table 4.

TABLE 4

|  | YSNR10 |
| --- | --- |
| Example 1 | 85 |
| Example 2 | 84 |
| Comparative Example 1 | 86 |

Referring to Table 4, it is confirmed that the photoelectric conversion devices according to Examples show lower YSNR10 than the photoelectric conversion device according to Comparative Example, thereby it is estimated that a sensitivity of the organic sensor may be improved.

While this disclosure has been described in connection with what is presently considered to be practical example embodiments, it is to be understood that the inventive concepts are not limited to the disclosed example embodi-

What is claimed is:

1. A photoelectric conversion device, comprising:
a first electrode and a second electrode facing each other;
a photoelectric conversion layer between the first electrode and the second electrode, the photoelectric conversion layer configured to absorb light in at least one part of a wavelength spectrum of light and to convert the absorbed light into an electric signal; and
an organic auxiliary layer between the first electrode and the photoelectric conversion layer, the organic auxiliary layer having a higher charge carrier mobility than a corresponding charge carrier mobility of the photoelectric conversion layer.

2. The photoelectric conversion device of claim 1, wherein the charge carrier mobility of the organic auxiliary layer is at least about 100 times as high as the corresponding charge carrier mobility of the photoelectric conversion layer.

3. The photoelectric conversion device of claim 1, wherein the charge carrier mobility of the organic auxiliary layer is greater than or equal to about $1.0 \times 10^{-3}$ cm$^2$/Vs.

4. The photoelectric conversion device of claim 1, wherein
the photoelectric conversion layer includes a first organic material,
the organic auxiliary layer includes a second organic material that is different from the first organic material, and
a charge carrier mobility of the second organic material is about 100 times or greater as high as a charge carrier mobility of the first organic material.

5. The photoelectric conversion device of claim 4, wherein the charge carrier mobility of the second organic material is greater than or equal to about $1.0 \times 10^{-3}$ cm$^2$/Vs.

6. The photoelectric conversion device of claim 4, wherein the second organic material includes a second organic material compound that is a fused polycyclic aromatic compound, a fused polycyclic heteroaromatic compound, or a combination thereof.

7. The photoelectric conversion device of claim 6, wherein the second organic material compound includes at least four rings that are fused.

8. The photoelectric conversion device of claim 6, wherein
the second organic material compound is the fused polycyclic heteroaromatic compound, and
the fused polycyclic heteroaromatic compound includes S, Se, Te, or a combination thereof.

9. The photoelectric conversion device of claim 4, wherein
the photoelectric conversion layer further includes a semiconductor material that forms a pn junction with the first organic material, the semiconductor material including a p-type semiconductor and/or an n-type semiconductor, and
the organic auxiliary layer further includes the semiconductor material.

10. The photoelectric conversion device of claim 9, wherein the semiconductor material includes fullerene or a fullerene derivative.

11. The photoelectric conversion device of claim 1, wherein a thickness of the organic auxiliary layer is less than or equal to about 5 nm.

12. The photoelectric conversion device of claim 1, further comprising:
an inorganic nanolayer between the first electrode and the photoelectric conversion layer.

13. The photoelectric conversion device of claim 12, wherein the inorganic nanolayer includes a lanthanide element, calcium (Ca), potassium (K), aluminum (Al), or an alloy thereof.

14. The photoelectric conversion device of claim 13, wherein the inorganic nanolayer includes the lanthanide element, and the lanthanide element includes ytterbium (Yb).

15. The photoelectric conversion device of claim 12, wherein a thickness of the inorganic nanolayer is less than or equal to about 5 nm.

16. The photoelectric conversion device of claim 12, wherein
the organic auxiliary layer is in contact with the photoelectric conversion layer and
the inorganic nanolayer is in contact with the first electrode.

17. The photoelectric conversion device of claim 1, wherein the first electrode is a cathode and the second electrode is an anode.

18. An electronic device comprising the photoelectric conversion device of claim 1.

19. An organic sensor comprising the photoelectric conversion device of claim 1.

20. An electronic device comprising the organic sensor of claim 19.

21. An organic sensor, comprising:
a semiconductor substrate; and
a plurality of photoelectric conversion devices on the semiconductor substrate, the plurality of photoelectric conversion devices configured to convert different wavelength spectra of light into electric signals, respectively, each photoelectric conversion device of the plurality of photoelectric conversion devices including
a first electrode and a second electrode facing each other,
a photoelectric conversion layer between the first electrode and the second electrode, the photoelectric conversion layer configured to absorb light in at least one part of a wavelength spectrum of light and to convert the absorbed light into an electric signal, and
an organic auxiliary layer between the first electrode and the photoelectric conversion layer, the organic auxiliary layer having a higher charge carrier mobility than a corresponding charge carrier mobility of the photoelectric conversion layer,
wherein the plurality of photoelectric conversion devices include different photoelectric conversion layers configured to absorb different wavelength spectra of light.

22. The organic sensor of claim 21, wherein the plurality of photoelectric conversion devices are arranged horizontally on the semiconductor substrate, such that the plurality of photoelectric conversion devices overlap each other in a direction extending parallel to a top surface of the semiconductor substrate.

23. The organic sensor of claim 21, wherein
the plurality of photoelectric conversion devices are arranged vertically on the semiconductor substrate, such that the plurality of photoelectric conversion devices overlap each other in a direction extending perpendicular to a top surface of the semiconductor substrate, and one photoelectric conversion device of the plurality of photoelectric conversion devices overlaps with a limited portion of another photoelectric conversion device of the plurality of photoelectric conversion devices in the direction extending perpendicular to the top surface of the semiconductor substrate.

24. The organic sensor of claim 21, wherein the charge carrier mobility of the organic auxiliary layer of a given photoelectric conversion device of the plurality of photoelectric conversion devices is at least about 100 times as high as the corresponding charge carrier mobility of the photoelectric conversion layer of the given photoelectric conversion device.

25. The organic sensor of claim 21, wherein
the photoelectric conversion layer of a given photoelectric conversion device of the plurality of photoelectric conversion devices includes a first organic material,
the organic auxiliary layer of the given photoelectric conversion device includes a second organic material that is different from the first organic material, and
a charge carrier mobility of the second organic material is about 100 times or greater as high as a charge carrier mobility of the first organic material.

26. The organic sensor of claim 21, wherein at least one photoelectric conversion device of the plurality of photoelectric conversion devices includes
an inorganic nanolayer between the first electrode of the at least one photoelectric conversion device and the photoelectric conversion layer of the at least one photoelectric conversion device.

27. The organic sensor of claim 21, wherein the plurality of photoelectric conversion devices include a common first electrode that extends continuously between the plurality of photoelectric conversion devices.

28. An organic sensor, comprising:
a semiconductor substrate;
a photo-sensing device integrated in the semiconductor substrate, the photo-sensing device configured to convert a first wavelength spectrum of light into electric signals; and
a photoelectric conversion device on the semiconductor substrate, the photoelectric conversion device configured to convert a second wavelength spectrum of light into electric signals, the photoelectric conversion device including
a first electrode and a second electrode facing each other,
a photoelectric conversion layer between the first electrode and the second electrode, the photoelectric conversion layer configured to absorb light in at least one part of a wavelength spectrum of light and to convert the absorbed light into electric signals, and
an organic auxiliary layer between the first electrode and the photoelectric conversion layer, the organic auxiliary layer having a higher charge carrier mobility than a corresponding charge carrier mobility of the photoelectric conversion layer.

29. The organic sensor of claim 28, further comprising:
a color filter configured to selectively transmit a particular wavelength spectrum of light to the photo-sensing device, such that the photo-sensing device is configured to absorb the particular wavelength spectrum of light.

30. The organic sensor of claim 28, wherein the charge carrier mobility of the organic auxiliary layer is at least about 100 times as high as the corresponding charge carrier mobility of the photoelectric conversion layer.

31. The organic sensor of claim 28, wherein
the photoelectric conversion layer includes a first organic material,
the organic auxiliary layer includes a second organic material that is different from the first organic material, and
a charge carrier mobility of the second organic material is about 100 times or greater as high as the a charge carrier mobility of the first organic material.

32. The organic sensor of claim 28, wherein the photoelectric conversion device further includes
an inorganic nanolayer between the first electrode and the photoelectric conversion layer.

* * * * *